(12) United States Patent
Watanabe et al.

(10) Patent No.: US 11,234,329 B2
(45) Date of Patent: Jan. 25, 2022

(54) PREPREG, SUBSTRATE, METAL-CLAD LAMINATE, SEMICONDUCTOR PACKAGE, AND PRINTED CIRCUIT BOARD

(71) Applicant: PANASONIC INTELLECTUAL PROPERTY MANAGEMENT CO., LTD., Osaka (JP)

(72) Inventors: Rihoko Watanabe, Osaka (JP); Keiko Kashihara, Osaka (JP); Hiroharu Inoue, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 65 days.

(21) Appl. No.: 16/954,020

(22) PCT Filed: Dec. 4, 2018

(86) PCT No.: PCT/JP2018/044616
§ 371 (c)(1),
(2) Date: Jun. 15, 2020

(87) PCT Pub. No.: WO2019/124062
PCT Pub. Date: Jun. 27, 2019

(65) Prior Publication Data
US 2021/0092835 A1    Mar. 25, 2021

(30) Foreign Application Priority Data

Dec. 21, 2017  (JP) .............................. JP2017-244720

(51) Int. Cl.
*H01L 23/02*     (2006.01)
*H05K 1/03*      (2006.01)
(Continued)

(52) U.S. Cl.
CPC ............... *H05K 1/03* (2013.01); *H01L 23/12* (2013.01); *H01L 23/3128* (2013.01); *H01L 24/16* (2013.01)

(58) Field of Classification Search
CPC ....... H05K 1/03; H01L 23/3128; H01L 23/12; H01L 24/16
(Continued)

(56) References Cited

U.S. PATENT DOCUMENTS 8,997,340 B2 * 4/2015 Sohn ..................... B29C 66/472
                                                29/846
10,703,874 B2 * 7/2020 Takano .................... B32B 5/28
2015/0118499 A1 4/2015 Suzuki et al.

FOREIGN PATENT DOCUMENTS

JP      H09-209233 A    8/1997
JP      2013-040270 A   2/2013
(Continued)

OTHER PUBLICATIONS

International Search Report and Written Opinion issued in International Patent Application No. PCT/JP2018/044616, dated Mar. 12, 2019; with partial English translation.

*Primary Examiner* — Luan C Thai
(74) *Attorney, Agent, or Firm* — McDermott Will and Emery LLP

(57) ABSTRACT

A prepreg is used to fabricate a semiconductor package including a chip and a substrate to mount the chip thereon. The prepreg is in a semi-cured state. The substrate includes a cured product of the prepreg. The chip has: a first chip surface located opposite from the substrate; and a second chip surface located opposite from the first chip surface. The prepreg satisfies the relational expression: $0.9 \leq X_2/X_1 \leq 1.0$ (I), where $X_1$ is a coefficient of thermal expansion of the first chip surface of the chip before the chip is mounted on the (Continued)

substrate, and $X_2$ is a coefficient of thermal expansion of the first chip surface of the chip after the chip has been mounted on the substrate.

6 Claims, 16 Drawing Sheets

(51) Int. Cl.
*H01L 23/12* (2006.01)
*H01L 23/31* (2006.01)
*H01L 23/00* (2006.01)

(58) Field of Classification Search
USPC .......................................................... 257/686
See application file for complete search history.

(56) References Cited

FOREIGN PATENT DOCUMENTS

| | | |
|---|---|---|
| JP | 2013-071940 A | 4/2013 |
| JP | 2014-037486 A | 2/2014 |
| JP | 2016-148040 A | 8/2016 |
| JP | 2017-132858 A | 8/2017 |
| WO | 2013/141247 A1 | 9/2013 |

\* cited by examiner

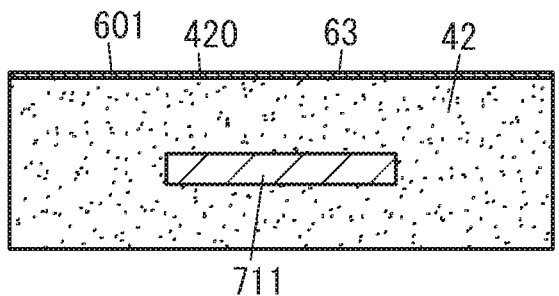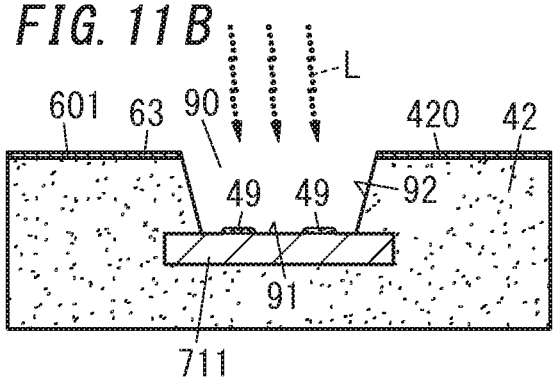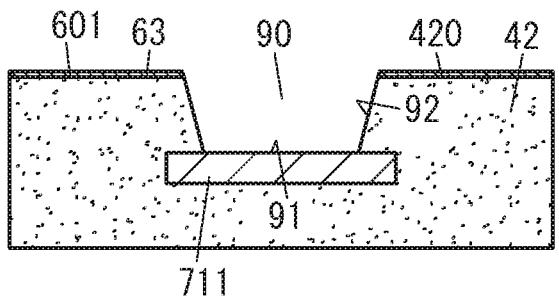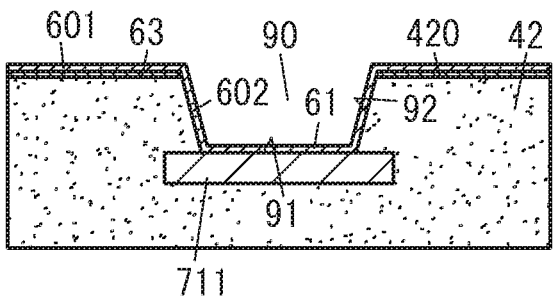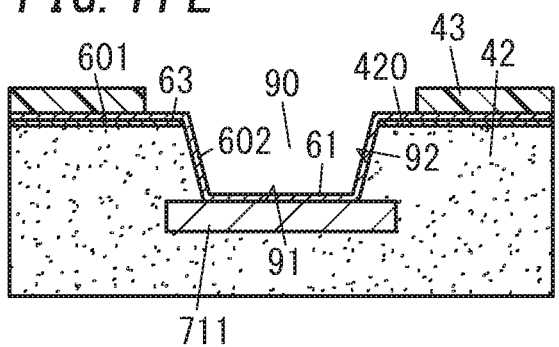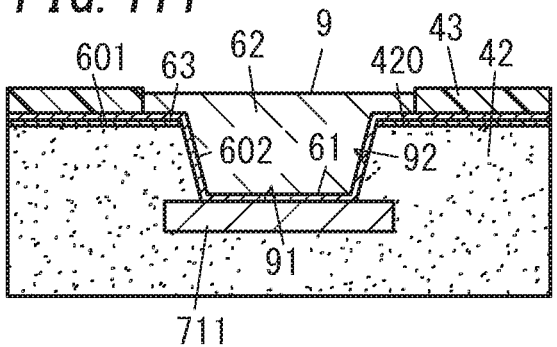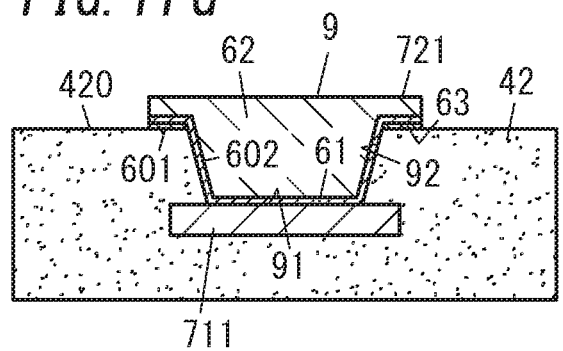

PREPREG, SUBSTRATE, METAL-CLAD LAMINATE, SEMICONDUCTOR PACKAGE, AND PRINTED CIRCUIT BOARD

CROSS-REFERENCE OF RELATED APPLICATIONS

This application is the U.S. National Phase under 35 U.S.C. § 371 of International Patent Application No. PCT/JP2018/044616, filed on Dec. 4, 2018, which in turn claims the benefit of Japanese Application No. 2017-244720, filed on Dec. 21, 2017, the entire disclosures of which Applications are incorporated by reference herein.

TECHNICAL FIELD

The present disclosure generally relates to a prepreg, a substrate, a metal-clad laminate, a semiconductor package, and a printed circuit board. More particularly, the present disclosure relates to a prepreg for use to fabricate a semiconductor package, a substrate including a cured product of the prepreg, a metal-clad laminate including an insulating layer and a metal layer, a semiconductor package including a chip and the substrate, and a printed circuit board including the semiconductor package and a printed wiring board.

BACKGROUND ART

A technique for decreasing the coefficient of thermal expansion, and increasing the modulus of elasticity, of a substrate in order to reduce the warpage of a substrate when a chip is mounted on the substrate during the manufacturing process of a semiconductor package has been known in the art (see, for example, Patent Literature 1).

According to Patent Literature 1, a prepreg as a material for the substrate includes a thermosetting resin composition. The thermosetting resin composition includes a thermosetting resin, a filler, and an amino modified siloxane. Specifically, the filler includes a plate filler, and the amino modified siloxane includes an aromatic azomethine skeleton containing amino modified siloxane, thus decreasing the coefficient of thermal expansion, and increasing the modulus of elasticity, of the cured product of the thermosetting resin composition.

The substrate needs to have a decreased coefficient of thermal expansion and an increased modulus of elasticity for the following purpose. Specifically, its coefficient of thermal expansion needs to be decreased in order to reduce the difference in coefficient of thermal expansion (CTE) between the substrate and the chip. On the other hand, its modulus of elasticity needs to be increased to allow the substrate to withstand the thermal stress caused in the chip. In this manner, an attempt to reduce the warpage of the substrate while the chip is being mounted on the substrate has been made by decreasing the coefficient of thermal expansion and increasing the modulus of elasticity at the same time.

Increasing the modulus of elasticity of the substrate, however, increases the chances of causing significant stress to the chip even when the difference in coefficient of thermal expansion between the substrate and the chip has been decreased. This stress could induce the warpage of the semiconductor package.

CITATION LIST

Patent Literature

Patent Literature 1: JP 2017-132858 A

SUMMARY OF INVENTION

It is an object of the present disclosure to provide a prepreg, a substrate, a metal-clad laminate, a semiconductor package, and a printed circuit board, all of which are configured to reduce the warpage of the semiconductor package.

A prepreg according to an aspect of the present disclosure is used to fabricate a semiconductor package including a chip and a substrate to mount the chip thereon. The prepreg is in a semi-cured state. The substrate includes a cured product of the prepreg. The chip has: a first chip surface located opposite from the substrate; and a second chip surface located opposite from the first chip surface. The prepreg satisfies the following relational expression (I):

[Numerical Expression 1]

$$0.9 \leq X_2/X_1 \leq 1.0 \quad (I)$$

where $X_1$ is a coefficient of thermal expansion of the first chip surface of the chip before the chip is mounted on the substrate, and $X_2$ is a coefficient of thermal expansion of the first chip surface of the chip after the chip has been mounted on the substrate.

A substrate according to another aspect of the present disclosure includes a cured product of the prepreg.

A metal-clad laminate according to still another aspect of the present disclosure includes: an insulating layer; and a metal layer provided on at least one surface of the insulating layer. The insulating layer includes a cured product of the prepreg.

A semiconductor package according to yet another aspect of the present disclosure includes: a chip; and a substrate to mount the chip thereon. The substrate includes a cured product of the prepreg.

A printed circuit board according to yet another aspect of the present disclosure includes: the semiconductor package; and a printed wiring board to mount the semiconductor package thereon.

BRIEF DESCRIPTION OF DRAWINGS

FIGS. 11A-11G are schematic cross-sectional views illustrating a series of process steps of a modified semi-additive process;

DESCRIPTION OF EMBODIMENTS

[Prepreg]
(1) Overview

Figure 1A:
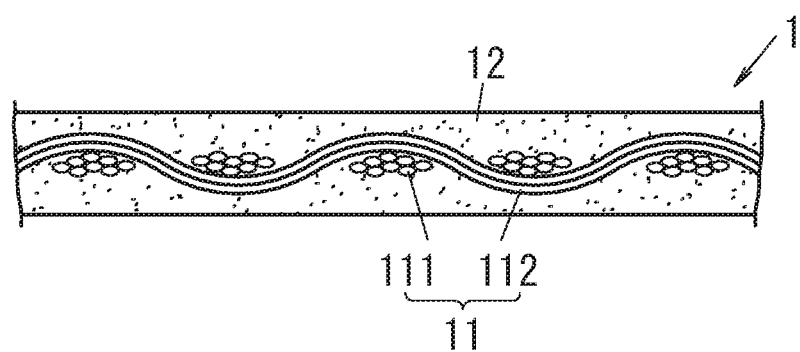
FIG. 1A is a schematic cross-sectional view illustrating a prepreg according to an exemplary embodiment of the present disclosure.
Figure 1B:
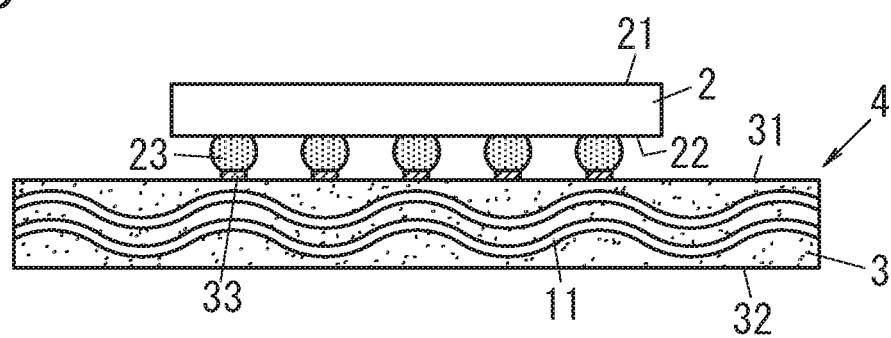
FIG. 1B is a schematic cross-sectional view illustrating a semiconductor package according to the exemplary embodiment of the present disclosure.

FIG. 1A illustrates a prepreg 1 according to an exemplary embodiment. This prepreg 1 is used to fabricate the semiconductor package 4 shown in FIG. 1B. This prepreg 1 is in a semi-cured state but will be processed into a substrate 3 in a cured state when the semiconductor package 4 is fabricated. That is to say, the substrate 3 includes a cured product of the prepreg 1. The semiconductor package 4 includes a chip 2 and the substrate 3. The chip 2 is mounted onto the substrate 3.

Figure 2A:
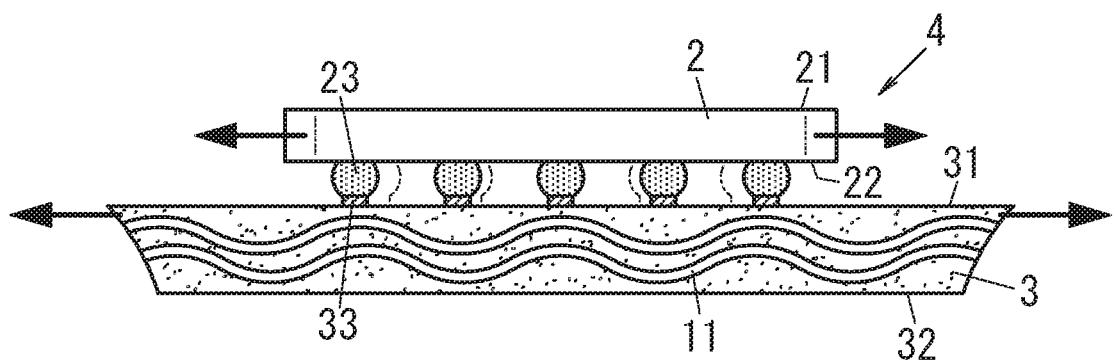
FIG. 2A illustrates how in the semiconductor package, its substrate behaves when its chip expands.
Figure 2B:
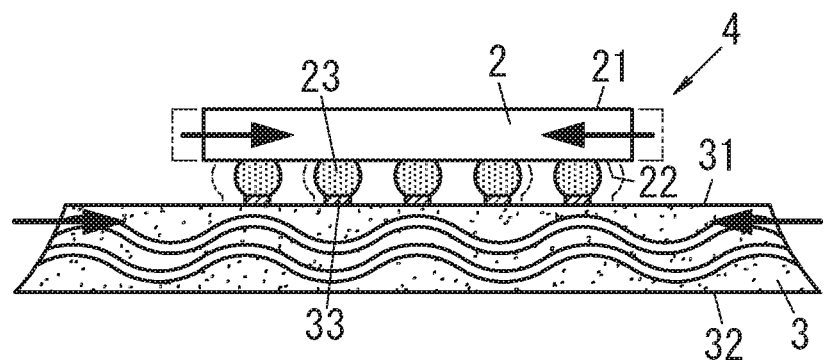
FIG. 2B illustrates how in the semiconductor package, its substrate behaves when its chip shrinks.

The semiconductor package 4 fabricated by using the prepreg 1 according to this embodiment may have its warpage reduced by the mechanism shown in FIGS. 2A and 2B even when its chip 2 expands or shrinks due to a temperature variation. Note that in FIGS. 2A and 2B, the behavior of the semiconductor package 4 is illustrated with exaggeration to make the warpage reduction mechanism easily understandable.

FIG. 2A illustrates how the semiconductor package 4 behaves when the chip 2 expands at a high temperature. As the chip 2 expands, the substrate 3 also expands accordingly without going against the chip's 2 behavioral pattern. More specifically, not the entire substrate 3 expands but only parts, located around the chip 2, of the substrate 3 expand to approximately the same degree as the chip 2. The rest of the substrate 3 does not expand that much.

On the other hand, FIG. 2B illustrates how the semiconductor package 4 behaves when the chip 2 shrinks at a low temperature. As the chip 2 shrinks, the substrate 3 also shrinks accordingly without going against the chip's 2 behavioral pattern. More specifically, not the entire substrate 3 shrinks but only parts, located around the chip 2, of the substrate 3 shrink to approximately the same degree as the chip 2. The rest of the substrate 3 does not shrink that much.

As can be seen, in this semiconductor package 4, only parts, located around the chip 2, of the substrate 3 do not go against, but follow, the chip's 2 behavioral pattern, thus reducing the chances of causing significant stress to the chip 2. In other words, this reduces the chances of causing significant strain to the chip 2, thus eventually reducing the warpage of the semiconductor package 4.

(2) Details
(2.1) Basic Configuration

A basic configuration for a prepreg 1 according to this embodiment will be described.

As shown in FIG. 1A, the prepreg 1 has the shape of a sheet. The thickness of the prepreg 1 is not particularly limited but may fall within the range from 5 μm to 200 μm, for example.

The prepreg 1 is in a semi-cured state. Specifically, part of the material for the prepreg 1 is a resin composition including a thermosetting resin, and the resin composition is in the semi-cured state. The resin composition will be described in detail later. The prepreg 1 may also include a base member 11, which will also be described later.

As used herein, the "semi-cured state" refers to an intermediate stage (Stage B) of a curing reaction. The intermediate stage is a stage between Stage A in the state of a varnish and Stage C in a fully cured state. When heated, the prepreg 1 melts once and then is cured fully to turn into a cured product. In the following description, solid matter in the semi-cured state will be hereinafter referred to as a "semi-cured product" and solid matter in the cured state will be hereinafter referred to as a "cured product."

The prepreg 1 has electrical insulation properties. The cured product of the prepreg 1 also has electrical insulation properties.

(2.2) Recognition Method

In short, the prepreg 1 according to this embodiment may be distinguished from a common prepreg by the following recognition method. First of all, the coefficient of thermal expansion of a chip 2 is measured. Next, a substrate 3 is made out of the prepreg 1, and the chip 2 is mounted on the substrate 3, thereby fabricating a semiconductor package 4. Thereafter, the coefficient of thermal expansion of the chip 2 that now forms part of the semiconductor package 4 is measured again. Then, it may be determined, by seeing if the ratio of the coefficients of thermal expansion of the chip 2 before and after mounting falls within a predetermined range, whether the given prepreg is the prepreg 1 according to this embodiment.

If the given prepreg is recognized to be a prepreg 1 according to this embodiment, prepregs 1 with the ability to reduce the warpage of the semiconductor package 4 may be mass-produced with the configuration of the prepreg 1 (in terms of the chemical makeup of the thermosetting resin composition) adopted as it is.

On the other hand, unless the given prepreg is recognized to be a prepreg 1 according to this embodiment, a prepreg 1 according to this embodiment may be obtained by appropriately changing the configuration of the prepreg 1 such that the ratio of the coefficients of thermal expansion of the chip 2 before and after mounting falls within a predetermined range.

A method for recognizing the given prepreg as a prepreg 1 according to this embodiment will be described in detail. In some of the accompanying drawings, X-, Y-, and Z-axes which are perpendicular to each other are shown to make the following description easily understandable. On the drawings, the Z-axis direction is supposed to be the upward/downward direction (thickness direction) with the positive Z-axis direction defined to be the upward direction and the negative Z-axis direction defined to be the downward direction. Note that this definition is adopted just for the sake of convenience.

(2.2.1) Chip

The chip 2 includes, as its major constituent element, a single-crystal silicon substrate 24, for example. The chip 2 may be a test element group (TEG) chip, for example, without limitation. Note that the TEG chip is generally used as a test chip for spotting any problem in design or manufacturing with an integrated circuit (IC) or a largescale integrated circuit (LSI), for example.

Figure 3A:
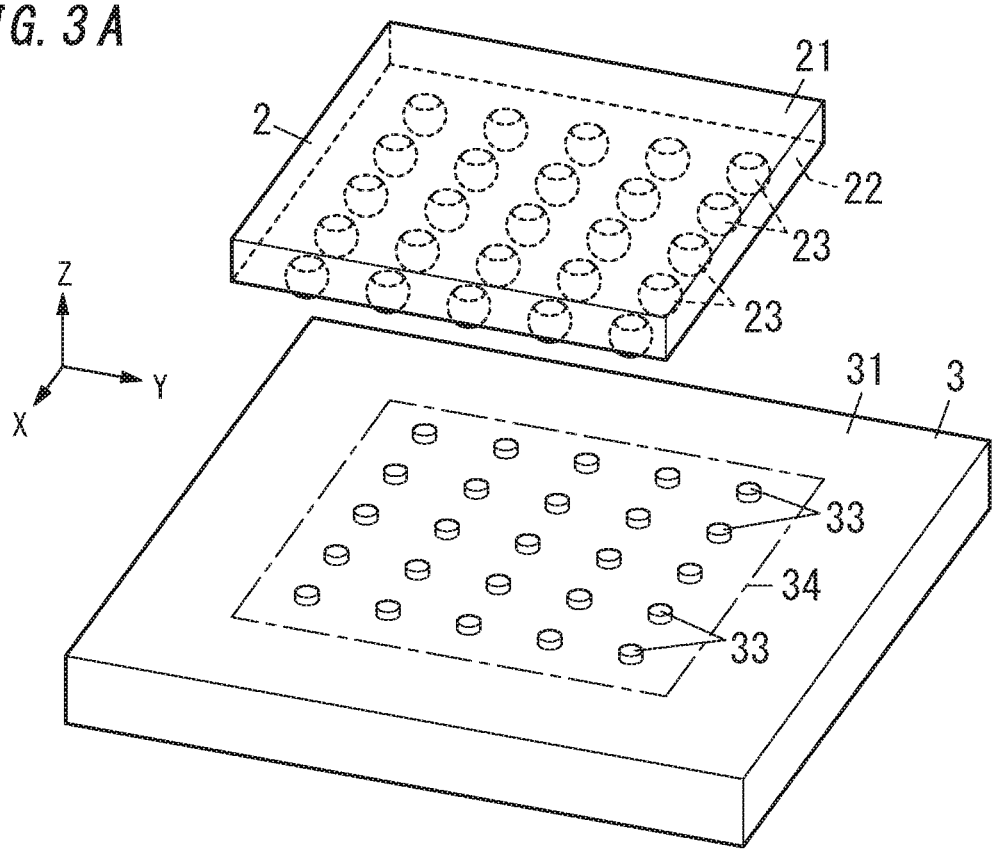
FIG. 3A is a perspective view illustrating the appearance of a chip yet to be mounted onto a substrate when viewed obliquely from above the chip.

As shown in FIG. 3A and other drawings, the chip 2 has the shape of a generally rectangular parallelepiped. The chip 2 has a first chip surface 21 and a second chip surface 22, which respectively form the principal surface and back surface of the chip 2. The thickness of the chip 2 (i.e., the distance between the first chip surface 21 and the second chip surface 22) is not particularly limited but may fall within the range from 20 μm to 300 μm, for example.

Figure 4A:
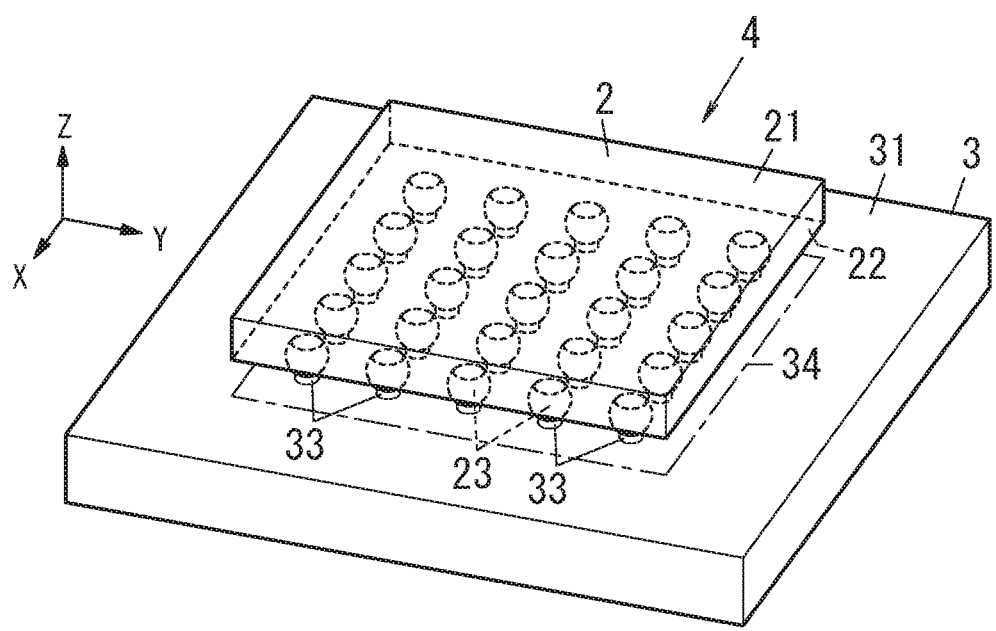
FIG. 4A is a perspective view illustrating the appearance of the chip that has been mounted onto the substrate when viewed obliquely from above the chip.

As shown in FIG. 4A and other drawings, the first chip surface 21 is located opposite from the substrate 3. When viewed from right over the chip 2, the first chip surface 21 has a generally square shape. Out of the four sides of the first chip surface 21, one pair of opposing sides is supposed to be parallel to the X-axis and the other pair of opposing sides is supposed to be parallel to the Y-axis for the sake of convenience. The dimensions of the first chip surface 21 are not particularly limited but may fall within the range from 3 mm×3 mm to 20 mm×20 mm, for example. That is to say, each side of the first chip surface 21 may have a length falling within the range from 3 mm to 20 mm, for example.

The second chip surface 22 is located opposite from the first chip surface 21. In other words, the second chip surface 22 is a surface to face the substrate 3. More specifically, the second chip surface 22 is a surface to face a first substrate surface 31 of the substrate 3. The shape and dimensions of the second chip surface 22 may be approximately the same as those of the first chip surface 21.

Figure 3B:
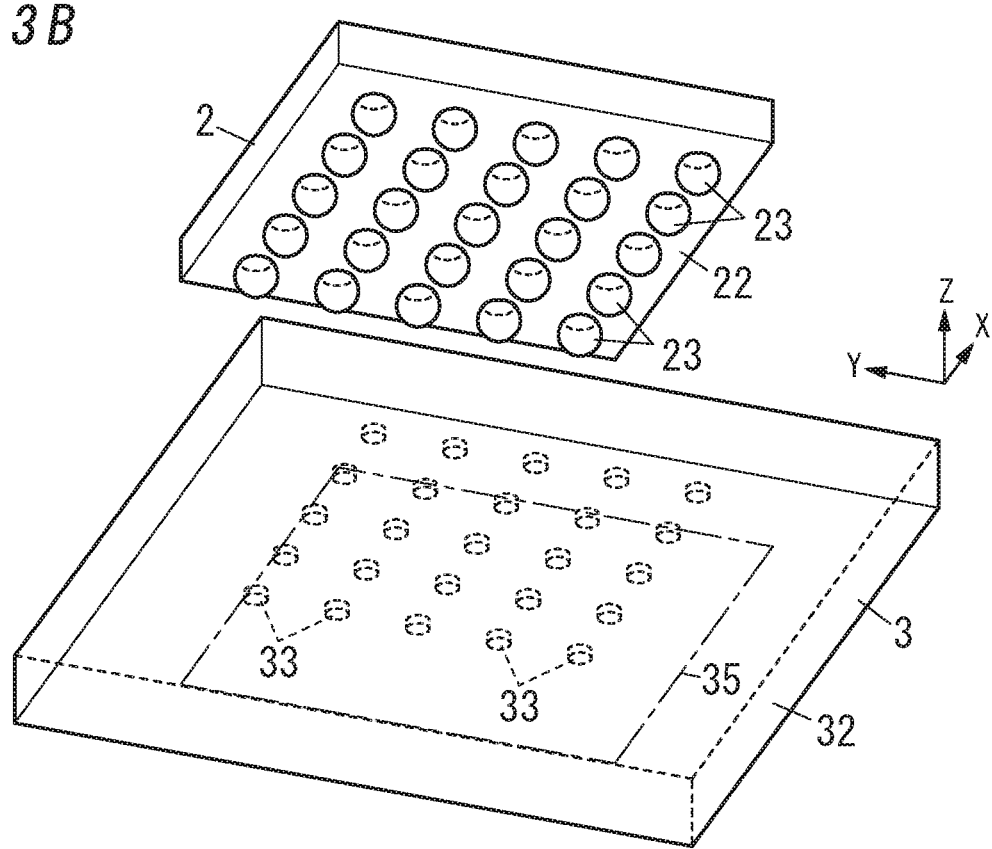
FIG. 3B is a perspective view illustrating the appearance of the chip yet to be mounted onto the substrate when viewed obliquely from below the chip.

As shown in FIG. 3B and other drawings, the chip 2 has a plurality of bumps 23. The plurality of bumps 23 is provided on the second chip surface 22. Each of the bumps 23 has a generally spherical shape.

Figure 5A:
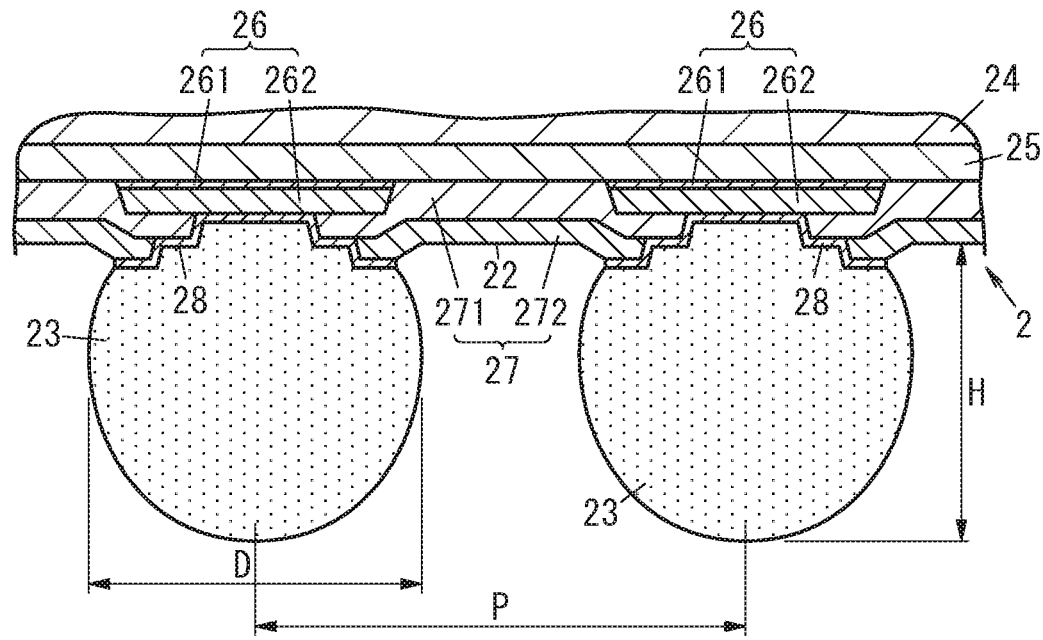
FIG. 5A is a schematic cross-sectional view illustrating a layered structure of a bonding region between a chip and bumps

With this regard, an exemplary layered structure for a bonding region where the bumps 23 are bonded onto the second chip surface 22 is shown in FIG. 5A. This layered structure will be described. The chip 2 includes a single-crystal silicon substrate 24 as its main constituent element, an undercoat layer 25, external terminals 26, a passivation layer 27, and an under-bump metal layer 28 (hereinafter referred to as a "UBM layer 28").

The undercoat layer 25 is formed to cover almost the entire surface of the single-crystal silicon substrate 24. The undercoat layer 25 is a silicon dioxide film deposited by plasma chemical vapor deposition (CVD) process.

Each of the external terminals 26 is provided for a bonding region for an associated bump 23. The external terminals 26 are each made up of two layers. Specifically, the external terminals 26 are formed by stacking a TiN layer 261 and an Al—Cu based alloy layer 262 in this order on the undercoat layer 25.

The passivation layer 27 is also made up of two layers. Specifically, the passivation layer 27 is formed by stacking an SiN layer 271 and a polyimide layer 272 in this order on the undercoat layer 25. The outer surface of the polyimide layer 272 defines the second chip surface 22. The SiN layer 271 is formed to cover the surface of the Al—Cu based alloy layer 262 of each external terminal 26 (except a generally central region thereof). The SiN layer 271 is formed by high density plasma (HDP) process, which is a type of plasma CVD process.

The UMB layer 28 is provided for the bonding region for each bump 23. The UMB layer 28 is formed to cover the generally central region of the surface of the Al—Cu based alloy layer 262 and the passivation layer 27. The UMB layer 28 is made up of Ti/NiV/Cu layers.

The bumps 23 are formed on the UMB layer 28. The bumps 23 are made of a solder alloy. Any solder alloy may be used without limitation. For example, SAC305 (Sn-3.0 Ag-0.5 Cu) may be used.

As shown in FIG. 5A, the bump diameter D of each bump 23 is not particularly limited. As used herein, the "bump diameter D" refers to the diameter of a generally circular profile of each bump 23 as viewed from right under itself.

As shown in FIG. 5A, the height H of each bump 23 is not particularly limited, either. As used herein, the "bump height H" refers to the distance from a generally flat surface of the second chip surface 22 to the tip of each bump 23 as viewed straight from beside the bump 23.

The plurality of bumps 23 are arranged parallel to each of the X-axis and Y-axis directions. The number of the bumps 23 arranged in the X-axis direction may be the same as the number of the bumps 23 arranged in the Y-axis direction. The total number of the bumps 23 provided is not particularly limited.

As shown in FIG. 5A, a bump pitch P is not particularly limited, either. As used herein, the "bump pitch P" refers to the interval between the respective centers of two bumps 23, 23 adjacent to each other in each of the X-axis and Y-axis directions.

Figure 5B:
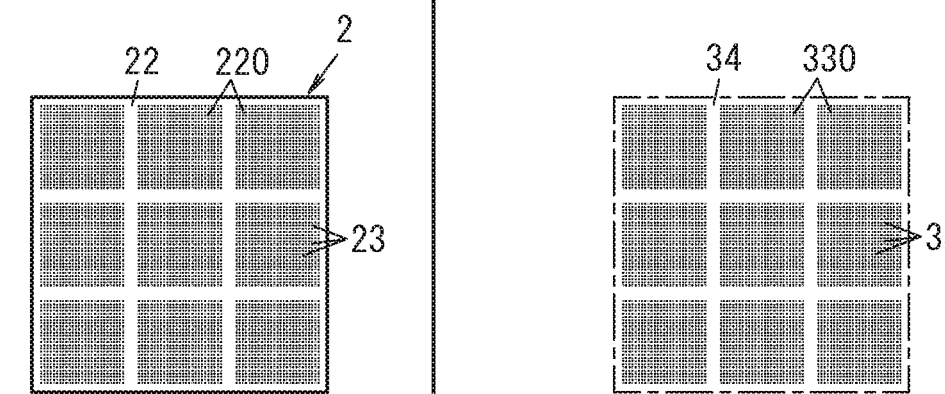
FIG. 5B is a bottom view illustrating a second chip surface of the chip.

With this regard, an exemplary arrangement of the bumps 23 on the chip 2 is illustrated in FIG. 5B. In FIG. 5B, the second chip surface 22 is divided into nine generally square blocks 220 consisting of 3 (in the X-axis direction) by 3 (in the Y-axis direction) blocks. In each of these nine blocks 220, the plurality of bumps 23 are arranged parallel to the X-axis and Y-axis directions. Note that the second chip surface 22 does not have to be divided into the plurality of blocks 220.

As shown in FIG. 5B, when the second chip surface 22 is divided into a plurality of blocks 220, the bump pitch P may be constant within each block 220 and the interval between two adjacent blocks 220 may be broader than the bump pitch P.

(2.2.2) Substrate

The substrate 3 may play the role of a package substrate (interposer). As shown in FIG. 3A and other drawings, the substrate 3 is configured as a rectangular plate, which is somewhat larger in dimensions than the chip 2. The substrate 3 has a first substrate surface 31 and a second substrate surface 32, which respectively define the principal surface and back surface of the substrate 3. The thickness of the substrate 3 (i.e., the distance between the first substrate surface 31 and the second substrate surface 32) is not particularly limited but may fall within the range from 0.01 mm to 1 mm, for example.

As shown in FIG. 4A and other drawings, the chip 2 is mounted onto the substrate 3. Specifically, the chip 2 is mounted onto the first substrate surface 31. More specifically, the chip 2 is mounted onto a mounting region 34 of the first substrate surface 31. The first substrate surface 31 of the substrate 3 is a surface that faces the chip 2. The shape of the first substrate surface 31 is not particularly limited but may be generally square, for example. Out of the four sides of the first substrate surface 31, one pair of opposing sides is supposed to be parallel to the X-axis and the other pair of opposing sides is supposed to be parallel to the Y-axis for the sake of convenience. The dimensions of the first substrate surface 31 are not particularly limited.

The second substrate surface 32 is located opposite from the first substrate surface 31. The shape and dimensions of the second substrate surface 32 may be approximately the same as those of the first substrate surface 31.

The substrate 3 includes a cured product of the prepreg 1. Specifically, the substrate 3 may be a cured product of a single prepreg 1. In that case, the substrate 3 may be formed by heating the prepreg 1 under pressure. Alternatively, the substrate 3 may be a cured product of two or more prepregs 1. In that case, the substrate 3 may be formed by stacking the two or more prepregs 1 one on top of another and heating the stack of the prepregs 1 under pressure. The substrate 3 has electrical insulation properties.

The temperature to which the prepreg 1 is heated is not particularly limited but may fall within the range from 180° C. to 400° C., for example. The pressure to be applied to the prepreg 1 is not particularly limited but may fall within the range from 0.1 MPa to 10 MPa, for example. The duration for which the prepreg 1 is heated and pressurized is not particularly limited but may fall within the range from 10 minutes to 300 minutes, for example. The number of the prepregs 1 used to make a single substrate 3 is not particularly limited but may fall within the range from one to eight, for example.

A single substrate 3 may include a single base member 11 (such as a woven fabric to be described later) or two or more base members 11, whichever is appropriate.

As shown in FIG. 3A and other drawings, the substrate 3 has a mounting region 34 (i.e., the region surrounded with the one-dot chain). The mounting region 34 is located at generally center of the first substrate surface 31. The mounting region 34 has approximately the same shape as the second chip surface 22. For example, if the second chip surface 22 has a generally square shape, then the mounting region 34 also has a similar, generally square shape. The mounting region 34 has substantially the same dimensions as the second chip surface 22. Out of the four sides of the mounting region 34, one pair of opposing sides is supposed to be parallel to the X-axis and the other pair of opposing sides is supposed to be parallel to the Y-axis for the sake of convenience.

As shown in FIG. 3A and other drawings, the substrate 3 includes a plurality of pads 33. The plurality of pads 33 is provided on the first substrate surface 31. Specifically, the plurality of pads 33 is provided within the mounting region 34 of the first substrate surface 31. Each of these pads 33 has a generally circular shape.

The pad diameter of each of these pads 33 is not particularly limited. As used herein, the pad diameter refers to the diameter of the generally circular pads 33 as viewed from right over the pads 33.

As shown in FIG. 3A, the plurality of pads 33 are arranged parallel to each of the X-axis and Y-axis directions. The number of the pads 33 arranged in the X-axis direction may be the same as the number of the pads 33 arranged in the Y-axis direction.

The total number of the pads 33 provided for the substrate 3 is the same as the total number of the bumps 23 provided for the chip 2. Within an XY plane, the relative locations of the plurality of pads 33 are the same as the relative locations of the plurality of bumps 23. The location of each of the plurality of pads 33 corresponds one to one to the location of an associated one of the plurality of bumps 23. The pad pitch is equal to the bump pitch P. As used herein, the pad pitch refers to the distance between the respective centers of pads 33 adjacent to each other in each of the X-axis and Y-axis directions.

Figure 5C:
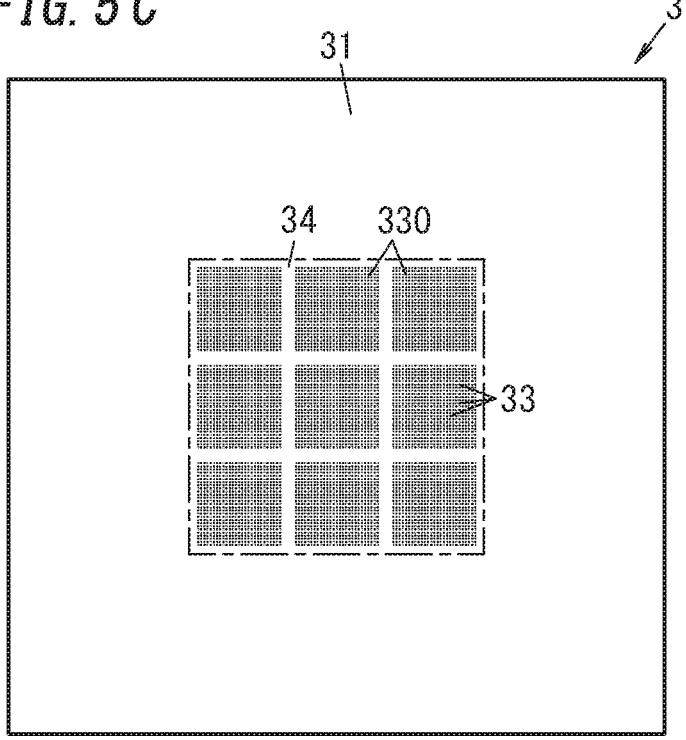
FIG. 5C is a plan view illustrating a first substrate surface of the substrate.

In this case, when the bumps 23 are arranged on the second chip surface 22 as shown in FIG. 5B, the pads 33 are arranged on the first substrate surface 31 of the substrate 3 as shown in FIG. 5C. In FIG. 5C, the mounting region 34 of the first substrate surface 31 is divided into nine generally square blocks 330 consisting of 3 (in the X-axis direction) by 3 (in the Y-axis direction) blocks. In each of these nine blocks 330, the plurality of pads 33 are arranged parallel to the X-axis and Y-axis directions. Each of these pads 33 is made of an electrical conductor. Any type of electrical conductor may be used without limitation, but copper may be used, for example.

(2.2.3) Semiconductor Package

As shown in FIG. 4A, the semiconductor package 4 includes the chip 2 and the substrate 3. The chip 2 is mounted onto the substrate 3 by bonding, with solder, the respective bumps 23 of the chip 2 onto their corresponding pads 33 of the substrate 3. The gap between the second chip surface 22 of the chip 2 and the first substrate surface 31 of the substrate 3 is not particularly limited. As already described in Section (2.2), this semiconductor package 4 may be used to determine, ex post facto, whether or not the prepreg 1 used as a material for the substrate 3 has desired properties. That is to say, this semiconductor package 4 may be used as a test semiconductor package.

(2.2.4) Measurement of Coefficient of Thermal Expansion

The coefficient of thermal expansion may be measured by digital image correlation (DIC). The digital image correlation is a technique for measuring displacement on the surface of an object by comparing an image of a figure (such as a dot pattern) drawn on the surface of the object which has been deformed with an image of the figure on the same object which has not been deformed yet. Thus, the digital image correlation also allows the coefficient of thermal expansion to be calculated.

The principle of the stereo method may be used to shoot the figure drawn on the surface of the object. Specifically, the displacement and strain distribution on a three-dimensional surface may be measured by shooting the figure on the surface of the object from multiple different directions using a plurality of cameras (such as CCD cameras). Alternatively, the figure on the surface of the object may be shot from multiple different directions using a single camera.

Specifically, in this embodiment, the coefficient of thermal expansion of the first chip surface 21 of the chip 2 is measured by digital image correlation twice separately before the chip 2 is mounted onto the substrate 3 and after the chip 2 has been mounted onto the substrate 3.

In this example, the coefficient of thermal expansion of the first chip surface 21 of the chip 2 before the chip 2 is mounted onto the substrate 3 as shown in FIG. 3A is designated by $X_1$ and the coefficient of thermal expansion of the first chip surface 21 of the chip 2 after the chip 2 has been mounted onto the substrate 3 as shown in FIG. 4A is designated by $X_2$. In short, $X_1$ indicates the coefficient of thermal expansion of the first chip surface 21 of the chip 2 yet to be mounted and $X_2$ indicates the coefficient of thermal expansion of the first chip surface 21 of the chip 2 mounted. In that case, according to this embodiment, the following relational expression (I) is satisfied:

[Numerical Expression 2]

$$0.9 \leq X_2/X_1 \leq 1.0 \quad (I)$$

Satisfying this relational expression (I) reduces the chances of causing significant stress to the chip 2 even when the chip 2 that has been mounted expands or shrinks due to a temperature variation. In other words, this tends to reduce the strain caused to the chip 2 mounted. That is to say, this allows the substrate 3 to expand or shrink as the chip 2 expands or shrinks, thus reducing the warpage of the semiconductor package 4. In addition, causing the substrate 3 to expand or shrink accordingly as the chip 2 expands or shrinks reduces the chances of causing significant stress to the bonding region between the chip 2 and the substrate 3. This allows the semiconductor package 4 to ensure sufficient reliability of electrical and physical connection between the chip 2 and the substrate 3.

That is to say, using such a prepreg 1 that satisfies the relational expression (I) as a material allows a semiconductor package 4 with reduced warpage to be obtained. In addition, in this semiconductor package 4, no significant stress is caused to the chip 2 and the strain caused is also insignificant. If significant stress were caused to the chip 2 mounted, then the substrate 3 should be thick enough to withstand the stress. In this embodiment, no significant stress is caused to the chip 2 mounted, and therefore, the thickness of the substrate 3 may be reduced. This contributes to reduction in the thickness of a semiconductor package 4 with reduced warpage. Note that the situation in which the stress is caused to the chip 2 and the distribution of the strain in the chip 2 may be confirmed by the digital image correlation.

Figure 16:
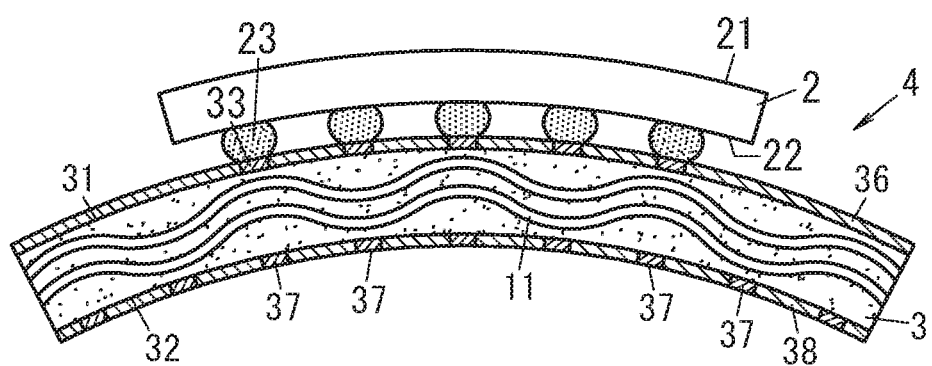
FIG. 16 illustrates how a common semiconductor package warps.

Unless the relational expression (I) is satisfied, the semiconductor package 4 may be warped as shown in FIG. 16. Alternatively, even though the semiconductor package 4 does not appear to be warped, significant stress may be caused to the chip 2, thus readily inducing its warpage. In each of these situations, significant stress tends to be caused to the bonding region between the chip 2 and the substrate 3, thus possibly making it impossible to ensure sufficient reliability of electrical and physical connection between the chip 2 and the substrate 3.

In addition, in this embodiment, the following relational expression (I) is suitably further satisfied:

[Numerical Expression 3]

$$1.05 \leq Y_1/Y_2 \leq 2.00 \quad (II)$$

Figure 4B:
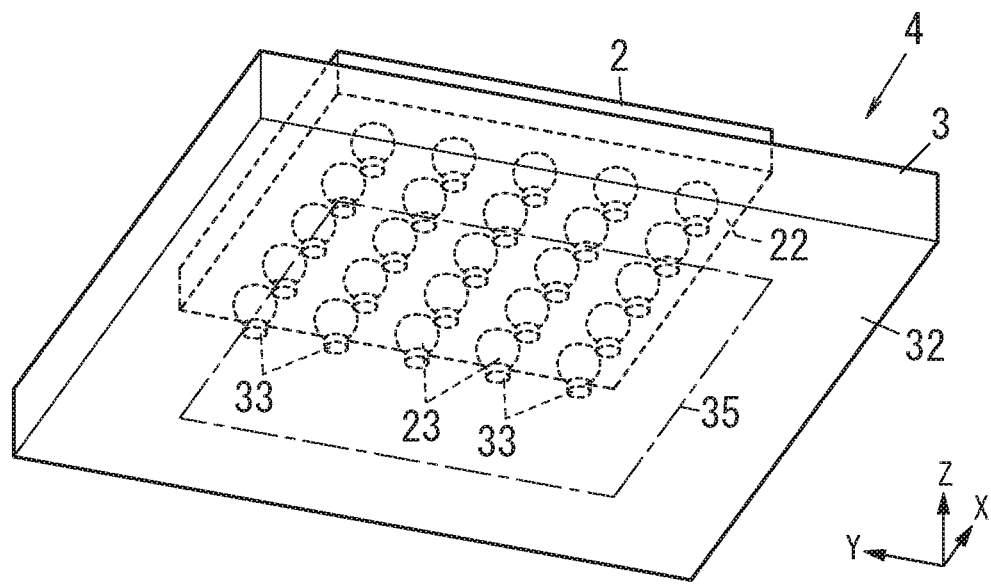
FIG. 4B is a perspective view illustrating the appearance of the chip that has been mounted onto the substrate when viewed obliquely from below the chip.

In the relational expression (II), $Y_1$ is a coefficient of thermal expansion of a region 35 on the second substrate surface 32 (i.e., the region surrounded with the one-dot chain and hereinafter referred to as "corresponding region 35"), located opposite from a region 34 (i.e., the mounting region 34) on the first substrate surface 31 on which the chip 2 is mounted, before the chip 2 is mounted on the first substrate surface 31 as shown in FIG. 3B. The corresponding region 35 is located right behind the mounting region 34. On the other hand, $Y_2$ is a coefficient of thermal expansion of the corresponding region 35 after the chip 2 has been mounted on the first substrate surface 31 as shown in FIG. 4B. In short, $Y_1$ is the coefficient of thermal expansion of the corresponding region 35 on the second substrate surface 32 of the substrate 3 before the chip 2 is mounted onto the substrate 3 and $Y_2$ is the coefficient of thermal expansion of the corresponding region 35 on the second substrate surface 32 of the substrate 3 after the chip 2 has been mounted onto the substrate 3.

Figure 15A:
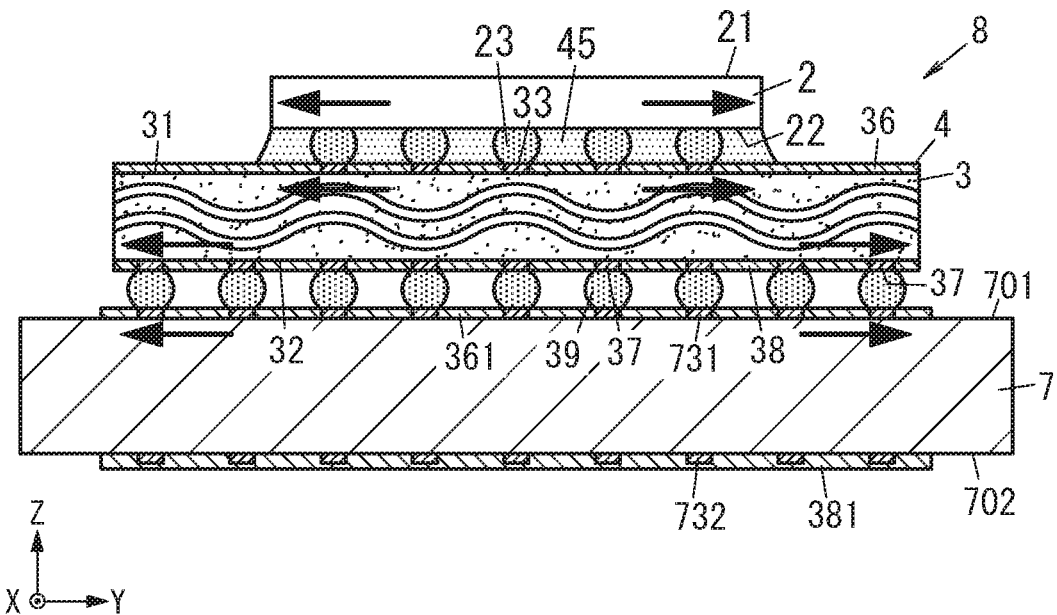
FIG. 15A illustrates how in the printed circuit board, its substrate behaves when its chip and printed wiring board expand.
Figure 15B:
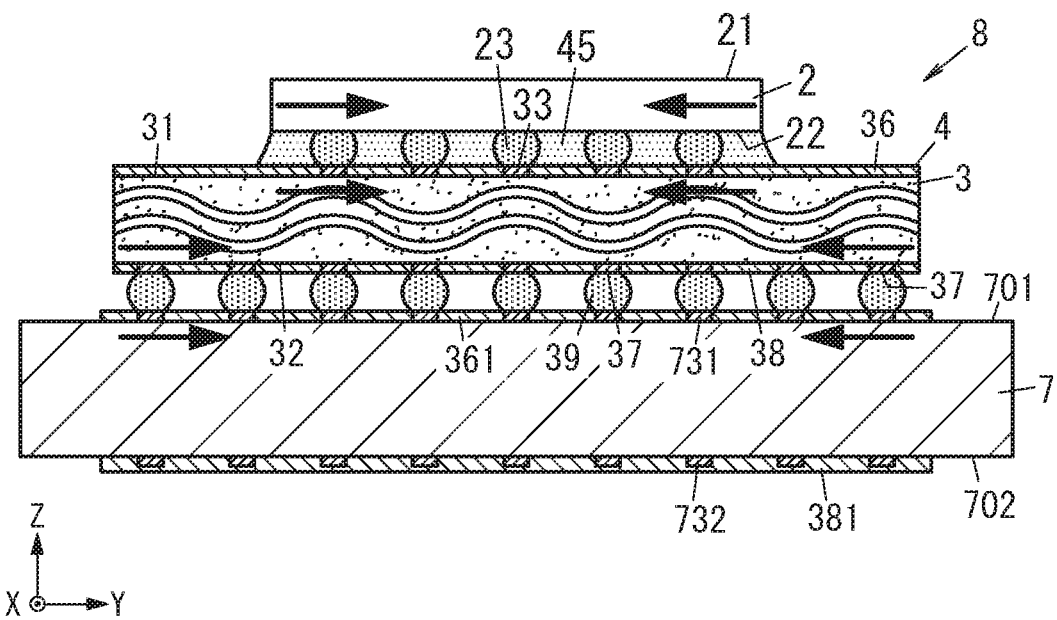
FIG. 15B illustrates how in the printed circuit board, its substrate behaves when its chip and printed wiring board shrink.

Satisfying this relational expression (II) allows reliability of connection to be ensured by the following mechanism even when the chip 2 and printed wiring board 7, which are located on both sides in the thickness direction of the substrate 3 in the printed circuit board 8, expand or shrink due to a temperature variation as shown in FIGS. 15A and 15B. As used herein, the "reliability of connection" refers to the reliability of electrical and physical connection between the chip 2 and the substrate 3 and the reliability of electrical and physical connection between the substrate 3 and the printed wiring board 7. Also, as used herein, the printed circuit board 8 refers to a circuit board that is able to operate as an electronic circuit on which a patterned conductor including pads have been formed and electronic parts including the semiconductor package 4 have been mounted. On the other hand, the printed wiring board 7 refers herein to a board on which just a patterned conductor has been formed and no electronic parts have been mounted yet. As used herein, the printed wiring board 7 plays the role of either a motherboard or a main board.

FIG. 15A illustrates the behavior of the printed circuit board 8 when the chip 2 and the printed wiring board 7 expand at a high temperature. The chip 2 and the printed wiring board 7 expand to mutually different degrees mainly due to a difference in their material. As the chip 2 and the printed wiring board 7 expand, the substrate 3 also expands accordingly following their behavioral pattern. More specifically, not the entire substrate 3 expands uniformly, but parts located around the chip 2 of the entire substrate 3 expand as much as the chip 2 and other parts located around the printed wiring board 7 of the entire substrate 3 expand as much as the printed wiring board 7.

On the other hand, FIG. 15B illustrates the behavior of the printed circuit board 8 when the chip 2 and the printed wiring board 7 shrink at a low temperature. The chip 2 and the printed wiring board 7 shrink to mutually different degrees mainly due to a difference in their material. As the chip 2 and the printed wiring board 7 shrink, the substrate 3 also shrinks accordingly following their behavioral pattern. More specifically, not the entire substrate 3 shrinks uniformly, but parts located around the chip 2 of the entire substrate 3 shrink as much as the chip 2 and other parts located around the printed wiring board 7 of the entire substrate 3 shrink as much as the printed wiring board 7.

In this manner, in the printed circuit board 8, parts located around the chip 2 of the entire substrate 3 do not go against, but follow, the behavioral pattern of the chip 2 and parts located around the printed wiring board 7 of the entire substrate 3 do not go against, but follow, the behavioral pattern of the printed wiring board 7. That is to say, as the chip 2 and the printed wiring board 7 expand or shrink, the substrate 3 also expands or shrinks accordingly. This reduces the chances of causing significant stress to the bonding region between the chip 2 and the substrate 3 or the bonding region between the substrate 3 and the printed wiring board 7, thus ensuring sufficient reliability of connection for the printed circuit board 8.

(2.3) Materials

Specific exemplary materials for the prepreg 1 according to this embodiment will be described.

As shown in FIG. 1A, the prepreg 1 includes a base member 11 and a semi-cured product 12 of a resin composition impregnated into the base member 11. Making the prepreg 1 of a composite material of the base member 11 and the semi-cured product 12 in this manner increases the chances of satisfying the relational expression (I) and the relational expression (II) described above.

(2.3.1) Base Member

Figure 6:
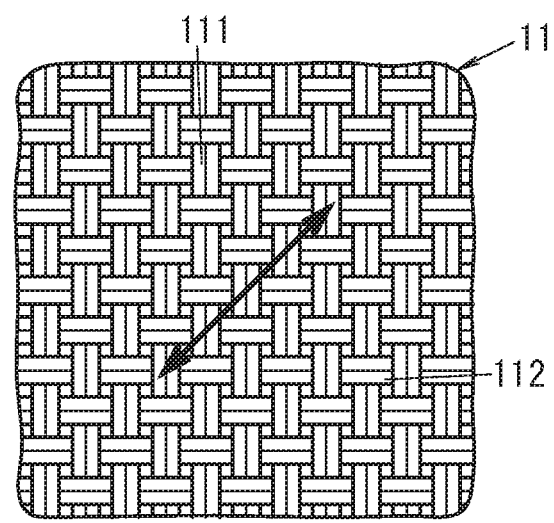
FIG. 6 is a schematic plan view illustrating a base member that forms part of a prepreg according to the exemplary embodiment of the present disclosure.

The base member 11 has electrical insulation properties. The base member 11 suitably includes a woven fabric base in which a warp 111 and a woof 112 are woven substantially perpendicularly to each other as shown in FIG. 6. Specific exemplary forms of weaving the woven fabric base include a plain weave, but it should not be construed as limiting. Specific examples of the woven fabric base include a base made of an inorganic fiber such as glass cloth and a base made of an organic fiber such as aramid cloth. The base member 11 may also be a non-woven fabric. The base member 11 suitably has a thickness falling within the range from 5 μm to 200 μm.

(2.3.2) Resin Composition

A semi-cured product 12 and cured product of the resin composition both have electrical insulation properties. The resin composition suitably includes at least one resin selected from the group consisting of epoxy resins, phenolic resins, imide resins, cyanate ester resins, acrylic resins, and vinyl ester resins. This allows the prepreg 1 to satisfy the relational expression (I), and eventually the relational expression (II) more easily.

The resin composition suitably contains: at least one of Component (A1) or Component (A2) to be described later; Component (B) to be described later; and at least one of Component (C1) or Component (C2) to be described later.

That is to say, the resin composition may contain both of Component (A1) and Component (A2), may contain Component (A1) without Component (A2), or may contain Component (A2) without Component (A1). Likewise, the resin composition may contain both of Component (C1) and Component (C2), may contain Component (C1) without Component (C2), or may contain Component (C2) without Component (C1).

The respective components of the resin composition will be described sequentially.

Component (A1) will be described. Component (A1) is a matrix resin that is a high rigidity component. Specifically. Component (A1) is an epoxy resin having at least one of a naphthalene skeleton or a biphenyl skeleton. As can be seen, the epoxy resin as Component (A1) may have both of a naphthalene skeleton and a biphenyl skeleton, may have only a naphthalene skeleton without a biphenyl skeleton, or may have only a biphenyl skeleton without a naphthalene skeleton. In the following description, an epoxy resin having a naphthalene skeleton without a biphenyl skeleton will be sometimes hereinafter referred to as a "naphthalene skeleton containing epoxy resin" and an epoxy resin having a biphenyl skeleton without a naphthalene skeleton will be sometimes hereinafter referred to as a "biphenyl skeleton containing epoxy resin."

Component (A2) will be described. Component (A2) is a matrix resin that is a high rigidity component. Specifically, Component (A2) is a phenolic resin having at least one of a naphthalene skeleton or a biphenyl skeleton. As can be seen, the phenolic resin as Component (A2) may have both of a naphthalene skeleton and a biphenyl skeleton, may have only a naphthalene skeleton without a biphenyl skeleton, or may have only a biphenyl skeleton without a naphthalene skeleton. In the following description, a phenolic resin having a naphthalene skeleton without a biphenyl skeleton will be sometimes hereinafter referred to as a "naphthalene skeleton containing phenolic resin" and a phenolic resin having a biphenyl skeleton without a naphthalene skeleton will be sometimes hereinafter referred to as a "biphenyl skeleton containing phenolic resin."

As can be seen, both of Components (A1) and (A2) have at least one of a naphthalene skeleton or a biphenyl skeleton, thus improving the heat resistance (such as solder heat resistance) of the cured product of the prepreg 1. Among other things, the naphthalene skeleton is a rigid skeleton. Thus, when at least one of Component (A1) or Component (A2) has a naphthalene skeleton, the heat resistance of the cured product of the prepreg 1 is further improvable.

Next, Component (B) will be described. Component (B) is a low elasticity component and may be an epoxy-modified acrylic resin, for example. Specifically, Component (B) has structures expressed by at least Formulae (b2) and (b3), respectively, among the following Formulae (b1), (b2), and (b3).

[Chemical Formula 1]

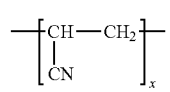

(b1)

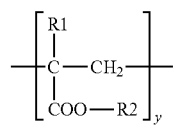

(b2)

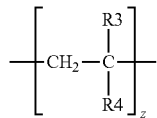

(b3)

In these chemical formulae, x in Formula (b1), y in Formula (b2), and z in Formula (b3) satisfy the following relation x:y:z (in mole fractions)=0:0.95:0.05 to 0.2:0.6:0.2 (where x+y+z≤1, 0≤x≤0.2, 0.6≤y≤0.95, and 0.05≤z≤0.2). In Formula (b2), R1 is either a hydrogen atom or a methyl group and R2 is selected from the group consisting of a hydrogen atom, an alkyl group, a glycidyl group, and an epoxidized alkyl group and includes at least one of the glycidyl group or the epoxidized alkyl group. In Formula (b3), R3 is either a hydrogen atom or a methyl group, and R4 is a phenyl group (-Ph), —COOCH$_2$Ph, or —COO(CH$_2$)Ph.

The main chain of Component (B) has structures expressed by at least Formulae (b2) and (b3), respectively, among these Formulae (b1), (b2), and (b3).

If the main chain of Component (B) has structures expressed by Formulae (b1), (b2) and (b3), respectively, the order of arrangement of the respective structures expressed by Formulae (b1), (b2), and (b3) is not particularly limited. In that case, in the main chain of Component (B), the structures expressed by Formula (b1) may or may not be continuous with each other, the structures expressed by Formula (b2) may or may not be continuous with each other, and the structures expressed by Formula (b3) may or may not be continuous with each other.

If the main chain of Component (B) has structures expressed by Formulae (b2) and (b3), respectively, the order of arrangement of the respective structures expressed by Formulae (b2) and (b3) is not particularly limited. In that case, in the main chain of Component (B), the structures expressed by Formula (b2) may or may not be continuous with each other, and the structures expressed by Formula (b3) may or may not be continuous with each other.

The significance of R2 in Formula (b2) including at least one of a glycidyl group or an epoxidized alkyl group among a hydrogen atom, an alkyl group, the glycidyl group, and the epoxidized alkyl group will be described as a supplement. The premise is that R2 in the structure expressed by the single Formula (b2) is a single ingredient. In the following description, a situation where Component (B) has one structure expressed by Formula (b2) and a situation where Component (B) has two or more structures expressed by Formula (b2) will be described separately.

In the former case, i.e., if Component (B) has one structure expressed by single Formula (b2), R2 is either a glycidyl group or an epoxidized alkyl group.

In the latter case, i.e., if Component (B) has structures expressed by two or more Formulae (b2), respectively, then R2 in the structure expressed by at least one Formula (b2) is either a glycidyl group or an epoxidized alkyl group, while R2 in the structure(s) expressed by the other Formula (or Formulae) (b2) is either a hydrogen atom or an alkyl group. Since R2 in the structure expressed by at least one Formula (b2) is either a glycidyl group or an epoxidized alkyl group, R2 in the structures expressed by all Formulae (b2) may also be either a glycidyl group or an epoxidized alkyl group.

The structure expressed by Formula (b3) includes a phenyl group (-Ph), —COOCH$_2$Ph, or —COO(CH$_2$)$_2$Ph. -Ph, —COOCH$_2$Ph, and —COO(CH$_2$)$_2$Ph are thermally stable enough to increase the strength of a cured product of the prepreg 1. This increases the moisture-heat resistance of the substrate fabricated using the prepreg 1 as a material.

Component (B) suitably has no unsaturated bonds (which may be double bonds or triple bonds) between adjacent carbon atoms. That is to say, in Component (B), adjacent carbon atoms are suitably bonded together with a saturated bond (single bond). This reduces oxidation with time, thus reducing an increase in brittleness due to the loss of elasticity.

Component (B) is a high molecular weight material with a weight average molecular weight (Mw) falling within the range from 200,000 to 850,000. The number of significant digits of the weight average molecular weight is two. That is to say, a numerical value to be 200,000 or 850,000 when rounded to the third place (i.e., the thousand place) also falls within the range from 200,000 to 850,000. If the weight average molecular weight of Component (B) is less than 200,000, then the chemical resistance of the cured product could decrease. Also, if the weight average molecular weight of Component (B) is greater than 850,000, then the moldability of the thermosetting resin composition could decrease. The weight average molecular weight (Mw) of Component (B) suitably falls within the range from 300,000 to 500.000.

Adding Component (B) to the resin composition decreases the moisture absorption of the cured product of the prepreg 1, thus increasing the moisture resistance of the substrate 3 and eventually improving the insulation reliability. In addition, even if the cured product of the prepreg 1 absorbs moisture, the moisture-heat resistance of the substrate 3 is still improvable, because the breaking strength of the resin that forms part of the cured product has been increased. Particularly, even if the insulating layer has a thickness of 0.2 mm or more, the swell of the insulating layer under the heat generated by soldering is still reducible because the moisture-heat resistance has been increased. Naturally, the moisture-heat resistance has also been increased even when the insulating layer has a thickness less than 0.2 mm.

In this embodiment, Components (A1) and (A2) and Component (B) are suitably in a phase separation state, instead of exhibiting compatibility, when the resin composition is semi-cured or cured. This curbs the decrease in the glass transition temperature (Tg) of a cured product of the prepreg 1, thus increasing the heat resistance (e.g., solder heat resistance) of the substrate 3.

The epoxy value of Component (B) suitably falls within the range from 0.01 eq/kg to 0.80 eq/kg. As used herein, the "epoxy value" refers to the number of equivalents of the epoxy group in 1 kg of Component (B). Component (B) having an epoxy value falling within this range makes Components (A1) and (A2) less easily compatible with Component (B). This curbs a decrease in the glass transition temperature (Tg) of a cured product of the prepreg 1 and increases the heat resistance of the substrate 3. The epoxy value of Component (B) more suitably falls within the range from 0.06 eq/kg to 0.40 eq/kg and even more suitably falls within the range from 0.14 eq/kg to 0.28 eq/kg.

Component (C1) will be described. Component (C1) is a first filler obtained by subjecting a first inorganic filler to surface treatment with a first silane coupling agent expressed by the following Formula (c1). That is to say, the first inorganic filler is an aggregate of fine particles. On the surface of those fine particles, the first silane coupling agent expressed by the following Formula (c1) is bonded chemically with their reaction group (which is silanol produced by hydrolysis of a methoxy group or an ethoxy group). The first filler as Component (C1) is formed in this manner.

[Chemical Formula 2]

$$(R6)Si(R5)_3 \tag{c1}$$

In Formula (c1), R5 is either a methoxy group or an ethoxy group, and R6 has an isocyanate group, a glycidyl group, or an amino group at an end of an aliphatic alkyl group with a carbon number of 3 to 18.

Specific examples of the first inorganic fillers include spherical silica, barium sulfate, silicon oxide powder, crushed silica, calcined talc, barium titanate, titanium oxide, clay, alumina, mica, boehmite, zinc borate, zinc stannate, and other metal oxides and metal hydrates.

It is recommended that the resin composition contain no inorganic fillers with a mean particle size of 45 µm or more. The resin composition containing such coarse particles could cause a significant decline in the insulation reliability of thin materials, in particular. Note that the mean particle size refers herein to a particle size at an integrated value of 50% in a particle size distribution obtained by laser diffraction and scattering method.

The first silane coupling agent expressed by Formula (c1) is trifunctional alkoxy silane in which an aliphatic alkyl group with a particular number of carbon atoms, including a particular functional group (which may be an isocyanate group, a glycidyl group, or an amino group) at an end, is bonded to a silicon atom.

Specific examples of the silane coupling agent including an isocyanate group at an end of an aliphatic alkyl group include 3-isocyanatepropyltriethoxy silane.

Specific examples of the silane coupling agent including a glycidyl group at an end of an aliphatic alkyl group include 3-glycidoxypropyltrimethoxy silane, 3-glycidoxypropyltriethoxy silane, and 3-glycidoxyoctyltrimethoxy silane.

Specific examples of the silane coupling agent including an amino group at an end of an aliphatic alkyl group include N-2-(aminoethyl)-3-aminopropyltrimethoxy silane, 3-aminopropyltrimethoxy silane, 3-aminopropyltriethoxy silane, and N-phenyl-3-aminopropyltrimethoxysilane.

When the first inorganic filler is subjected to surface treatment with the first silane coupling agent expressed by Formula (c1), the aliphatic alkyl group with a particular number of carbon atoms will be present on the surface of the first filler. To an end of this aliphatic alkyl group, bonded is an isocyanate group, a glycidyl group, or an amino group. These reaction groups have high affinity with the epoxy resin as Component (A1) and the phenolic resin as Component (A2). Therefore, these reaction groups cause the first filler as Component (C1), the epoxy resin as Component (A1), and the phenolic resin as Component (A2) to be chemically bonded with each other. Note that Component (B) is epoxy modified (see Formula (b2)) but has low affinity with Component (C1) because its amount is small. Therefore, when the resin composition is semi-cured or cured. Components (A1) and (A2) and Component (B) tend to have a phase-separated structure without exhibiting compatibility.

The aliphatic alkyl group of the reaction group R6 of the first silane coupling agent expressed by Formula (c1) has 3 to 18 carbon atoms. If the number of carbon atoms that the aliphatic alkyl group has were less than three, then the cured product of the prepreg 1 would have excessive elasticity.

Component (C2) will be described. Component (C2) is a second filler obtained by subjecting the second inorganic filler to surface treatment with a second silane coupling agent expressed by the following Formula (c2). That is to say, the second inorganic filler is an aggregate of fine particles. Onto the surface of those fine particles, the second silane coupling agent expressed by Formula (c2) is bonded chemically with its reaction group (which is either a methoxy group or an ethoxy group). The second filler as Component (C2) is formed in this manner.

[Chemical Formula 3]

$$(R8)Si(R7)_3 \tag{c2}$$

In Formula (c2), R7 is either a methoxy group or an ethoxy group, and R8 has a methacryloyl group or a vinyl group at an end of an aliphatic alkyl group with a carbon number of 3 to 18.

Specific examples of the second inorganic filler may be the same as those of Component (C1), i.e., may be the same as specific examples of the first inorganic filler. The first inorganic filler of Component (C1) and the second inorganic filler of Component (C2) may have either the same material and same mean particle size or different materials and different mean particle sizes, whichever is appropriate.

The second silane coupling agent is trifunctional alkoxy silane in which an aliphatic alkyl group with a particular number of carbon atoms, including a particular functional group (which may be either a methacryloyl group or a vinyl group) at an end, is bonded to a silicon atom. Note that the methacryloyl group is trivially called a "methacrylic group."

Specific examples of the silane coupling agent including a methacryloyl group at an end of an aliphatic alkyl group include 3-methacryloxypropyltrimethoxy silane, 3-methacryloxypropyltriethoxy silane, and 3-methacryloxyoctyltrimethoxy silane.

Specific examples of the silane coupling agent including a vinyl group at an end of an aliphatic alkyl group include vinyltrimethoxy silane and vinyltriethoxy silane.

When the second inorganic filler is subjected to surface treatment with the second silane coupling agent expressed by Formula (c2), the aliphatic alkyl group with a particular number of carbon atoms will be present on the surface of the second filler. To an end of this aliphatic alkyl group, bonded is either a methacryloyl group or a vinyl group. These reaction groups have high affinity with Component (B). Therefore, these reaction groups cause the second filler as Components (C2) and Component (B) to be chemically bonded together.

The aliphatic alkyl group of the reaction group R8 of the second silane coupling agent expressed by Formula (c2) suitably has 3 to 18 carbon atoms. If the number of carbon atoms that the aliphatic alkyl group has were less than three, then the cured product of the prepreg 1 would have excessive elasticity.

Generally speaking, in a cured product of a resin composition containing a resin and an inorganic filler, the resin tends to absorb more moisture than the inorganic filler does. Therefore, if the inorganic filler is dispersed non-uniformly in the cured product of the resin composition, then a lot of resin will be present in a portion where the inorganic filler is sparse, thus absorbing a lot of water there. On the other hand, plenty of resin will not be present in a portion where the inorganic filler is dense, thus absorbing less water. That is to say, non-uniform dispersion of the inorganic filler makes the dispersion of water absorbed non-uniform as well. When a cured product of such a resin composition is subjected to a moisture/heat resistance test, the result will be that water will be present non-uniformly and the localized water will vaporize to cause swelling.

In contrast, adding both of the two types of fillers (i.e., the first filler and the second filler), obtained by subjecting the two types of inorganic fillers (i.e., the first inorganic filler and the second inorganic filler) to surface treatment using two types of silane coupling agents (i.e., the first silane coupling agent and the second silane coupling agent), improves the moisture-heat resistance for the following reason. Specifically, the first filler as Component (C1) has high affinity with the epoxy resin as Component (A1) and the phenolic resin as Component (A2), while the second filler as Component (C2) has high affinity with Component (B). This reduces the chances of the entire first filler as Component (C1) and the entire second filler as Component (C2) being localized around Components (A1) and (A2) or localized around Component (B). That is to say, this allows the entire first and second fillers to be distributed uniformly in the cured product of the resin composition, and therefore, allows water to be dispersed and absorbed uniformly as well. This reduces not only the localization of water but also the chances of swelling, thus improving the moisture-heat resistance.

In addition, adding the first filler as Component (C1) and the second filler as Component (C2) to the resin composition increases the dimensional stability of the substrate as well.

Next, a common feature of the first filler as Component (C1) and the second filler as Component (C2) will be described. In the following description, "fillers" without any modifier will hereinafter collectively refer to both of the first filler and the second filler. Likewise, "inorganic fillers" without any modifier will hereinafter collectively refer to both of the first inorganic filler and the second inorganic filler. Furthermore, "silane coupling agents" without any modifier will hereinafter collectively refer to both of the first silane coupling agent expressed by Formula (c1) and the second silane coupling agent expressed by Formula (c2).

The aliphatic alkyl group has the capability of relieving the stress caused by the cured prepreg 1 during its thermal expansion or shrinkage. When the inorganic fillers are subjected to surface treatment with the silane coupling agents, a stress relieving layer produced from the aliphatic alkyl group will be formed on the surface of the inorganic fillers. Adding the fillers with the stress relieving layer to Components (A1), (A2), and (B) allows the stress caused to these Components (A1), (A2), and (B) due to thermal expansion or shrinkage to be relieved. This reduces the chances of the cured prepreg 1 with the fillers being thermally deformed. Thus, the moisture-heat resistance of the substrate 3 are further improvable. The presence of the aliphatic alkyl group on the surface of the fillers would relieve the stress for a couple of reasons. One reason is that the free rotational ability of the single bond of the alkyl group would allow the alkyl group of the filler to expand or shrink thermally, as Components (A1), (A2), and (B) expand or shrink thermally.

In addition, the aliphatic alkyl group also has the capability of reducing the etch depth for a desmear process (desmear etching process) to be performed after the metal-clad laminate 5, formed using the prepreg 1 as a material, has been subjected to hole cutting.

In this case, the desmear process is the process of removing resin smears, produced during the hole cutting process step by laser cutting or drilling, by chemical hole cleaning, for example. A specific desmear process may be potassium permanganate treatment, for example. In the potassium permanganate treatment, a desmear liquid, including alkali potassium permanganate as a main ingredient, is used.

The etch depth refers herein to the amount of the resin removed by the desmear process. An excessive etch depth could increase the diameter of a hole cut by the hole cutting process step. Thus, the etch depth is suitably as small as possible.

The presence of the aliphatic alkyl group on the surface of the fillers as described above reduces the permeation of the desmear liquid into the cured product of the resin composition, thus decreasing the etch depth. This allows an increase in the diameter of the holes to be reduced even when the desmear process is carried out.

The aliphatic alkyl group has, at an end thereof, an isocyanate group, a glycidyl group, an amino group, a methacryloyl group, or a vinyl group, and these functional groups are bonded strongly to Component (A1), (A2), or (B). This allows the etch depth to be reduced at the time of the desmear process, compared to a situation where none of the isocyanate group, glycidyl group, amino group, methacryloyl group, or vinyl group is present at the end of the aliphatic alkyl group.

Examples of methods for subjecting the inorganic fillers to surface treatment with the silane coupling agents include a direct treatment method, an integral blending method, and a dry concentrate method. When the inorganic fillers are subjected to surface treatment with the silane coupling agents, the amount of the silane coupling agents added to the inorganic fillers is not particularly limited. The amount of the silane coupling agents to be added to form a single molecular layer of the silane coupling agents over the entire surface of the inorganic fillers may be calculated by the following Equation (1). A suitable amount of the silane coupling agents to be added is 0.1 to 15 times as large as the value calculated by the following equation. In that case, the inorganic fillers will relieve the stress even more efficiently.

[Numerical Expression 4]

$$W_C = W_F \times S_F / S_C \quad (1)$$

where $W_C$ is the amount (g) of the silane coupling agents to be added to form a single molecular layer, $W_F$ is the amount (g) of the inorganic fillers added, $S_F$ is the specific surface area (m$^2$/g) of the inorganic fillers, and $S_C$ is the minimum area (m$^2$/g) covered by the silane coupling agents.

Either Component (C1) or Component (C2) is suitably a nanofiller with a mean particle size of 100 nm or less, and more suitably a nanofiller with a mean particle size falling within the range from 10 nm to 100 nm. If either Component (C1) or Component (C2) has a mean particle size of 100 nm or less, those locally deposited resin smears are easily removable by the desmear process. The effect to be achieved by removing the resin smears will be described in further detail. The main component of the resin smears would be Component (B) that is a substance with a high molecular weight. If either Component (C1) or Component (C2) is the nanofiller described above (which will be hereinafter referred to as a "first situation"), the nanofiller will be dispersed uniformly in the resin smears. Such resin smears are easily removable by the desmear process. On the other hand, if neither Component (C1) nor Component (C2) is the nanofiller (which will be hereinafter referred to as a "second situation"), the resin smears will consist essentially of the resin component. Such resin smears are removable by tightening the condition of the desmear process compared to the first situation but are removable less easily when the desmear process is carried out under the same condition as in the first situation. That is to say, supposing the desmear process is carried out under the same condition, the resin smears are removable more easily in a situation where either Component (C1) or Component (C2) has a mean particle size of 100 nm or less than in a situation where both Component (C1) and Component (C2) have a mean particle size greater than 100 nm. The reason is that the nanofiller with a mean particle size of 100 nm or less would be dispersed uniformly in the resin smears as described above. Either Component (C1) or Component (C2) having a mean particle size of 10 nm or more would reduce the thickening of the resin composition in a varnish state. In the following description, the nanofiller without any modifier will refer herein to either the first filler or second filler, whichever has a mean particle size of 100 nm or less.

In the resin composition, the ratio (by mass) of the sum of Components (A1) and (A2) to Component (B) suitably falls within the range from 90:10 to 50:50 and more suitably falls within the range from 80:20 to 60:40. In other words, with respect to 100 parts by mass of Components (A1), (A2), and (B) combined, the content of Component (B) suitably falls within the range from 10 to 50 parts by mass, and more suitably falls within the range from 20 parts by mass to 40 parts by mass. The hydroxyl equivalent of the phenolic resin as Component (A2) to one epoxy equivalent of the epoxy resin as Component (A1) suitably falls within the range from 0.2 to 1.1. The combined content of Components (C1) and (C2) suitably accounts for 80 mass % or less, and more suitably 50 mass % or less, of the entire resin composition. In that case, the combined content of Components (C1) and (C2) refers, when Components (C1) and (C2) are subjected to surface treatment with respectively predetermined silane coupling agents, to the content of the surface-treated Components (C1) and (C2) including the silane coupling agents. The ratio (by mass) of Component (C1) to Component (C2) suitably falls within the range from 98:2 to 60:40, and more suitably falls within the range from 95:5 to 80:20. In other words, the content of Component (C2) to 100 parts by mass of Components (C1) and (C2) combined suitably falls within the range from 2 parts by mass to 40 parts by mass, and more suitably falls within the range from 5 parts by mass to 20 parts by mass.

If either Component (C1) or Component (C2) is a nanofiller, then the content of the nanofiller suitably falls within the range from 1 part by mass to 30 parts by mass, and more suitably falls within the range from 3 parts by mass to 10 parts by mass, with respect to 100 parts by mass of Components (A1), (A2), and (B) combined. Adding at least 1 part by mass of the nanofiller would enhance the effect of removing the resin smears by the desmear process. More specifically, supposing the desmear process is carried out under the same condition, the resin smears are removable more easily in a situation where the content of the nanofiller is equal to or greater than 1 part by mass than in a situation where the content of the nanofiller is less than 1 part by mass. As long as the content of the nanofiller is 30 parts by mass or less, thickening of the resin composition in the varnish state is reducible.

The resin composition may further contain some additive. Specific examples of the additives include a phosphorus-based flame retardant. Adding the phosphorus-based flame retardant to the resin composition would improve the flame retardant property of the cured product of the prepreg 1 and the substrate 3. Note that even though the phosphorus-based flame retardant tends to absorb moisture, the phosphorus-based flame retardant may still be used in combination with two types of fillers obtained by subjecting two types of inorganic fillers to surface treatment with two types of silane coupling agents, which would improve the moisture-heat resistance. The phosphorus-based flame retardant hardly affects the dispersion of the inorganic fillers. When a small part (such as a semiconductor package 4) is fabricated with the resin composition, there is little need to impart the flame retardant property to that part. On the other hand, when a large part (such as a motherboard) is fabricated with the resin composition, there is much need to impart the flame retardant property to the part. That is why in the latter case, the phosphorus-based flame retardant is suitably added to the resin composition.

Optionally, the resin composition may further contain a curing accelerator. Examples of the curing accelerators include imidazoles and derivatives thereof, organic phosphorus compounds, metal soaps such as zinc octoate, secondary amines, tertiary amines, and quaternary ammonium salts.

(2.4) Physical Properties

A dielectric loss tangent (tan δ) chart is obtained by dynamic mechanical analysis (DMA) of a cured product of the prepreg 1 as a sample. This chart (tan δ curve) suitably has a peak in a temperature range of 100° C. or less and another peak in a temperature range of 200° C. or more, and more suitably has a peak in a temperature range of 60° C. or less and another peak in a temperature range of 200° C. or more. The peak in the temperature range of 200° C. or more is a main dispersion peak. The main dispersion peak is related to the main chain movement of the molecular structure of the cured product and is caused by the glass transition temperature (Tg). On the other hand, the peak in the temperature range of 100° C. or less or in the temperature range of 60° C. or less is a sub-dispersion peak. The sub-dispersion peak is related to the side chain movement of the molecular structure of the cured product and is caused by Component (B) with a high molecular weight, among other things. Shifting the sub-dispersion peak from 100° C. or less to 60° C. or less (i.e., toward a range with lower temperatures) imparts a higher elongation characteristic and even lower elasticity to the cured product.

The dynamic mechanical analysis described above may be conducted at a constant frequency (of 10 Hz, for example). The dielectric loss tangent (tan δ) is the ratio of the loss modulus of elasticity (E") to the storage modulus of elasticity (E'). That is to say, the dielectric loss tangent (tan δ)=loss modulus of elasticity (E")/storage modulus of elasticity (E'). In a dielectric loss tangent (tan δ) chart, the ordinate thereof indicates the dielectric loss tangent (tan δ) and the abscissa thereof indicates the temperature to represent the temperature dependence of the dielectric loss tangent (tan δ).

In the cured state, the prepreg 1 has a loss modulus of elasticity (E")/storage modulus of elasticity (E') ratio of 0.05 or more suitably in a temperature range of 100° C. or less and a temperature range of 200° C. or more, and more suitably in a temperature range of 60° C. or less and a temperature range of 20° C. or more. The peak value of the dielectric loss tangent (tan δ) of the prepreg 1 is 0.05 or more suitably in both of the temperature range of 100° C. or less and the temperature range of 200° C. or more, and more suitably in both of the temperature range of 60° C. or less and the temperature range of 200° C. or more.

The dielectric loss tangent (tan δ) chart having a peak of 0.05 or more in the temperature range of 100° C. or less and another peak of 0.05 or more in the temperature range of 200° C. or more allows the prepreg 1 to have features of both of Components (A1) and (A2) that are high rigidity components and Component (B) that is a low elasticity component. In addition, shifting the sub-dispersion peak from 100° C. or less to 60° C. or less (i.e., toward a range with lower temperatures) as described above imparts a higher elongation characteristic and an even lower elasticity to the cured product.

Furthermore, when the prepreg 1 includes a woven fabric as its base member 11, the cured product of the prepreg 1 suitably has a tensile elongation of 5% to less than 30% in a direction forming a tilt angle of 45 degrees with respect to the warp 111 or woof 112 of the woven fabric (e.g., in any of the directions indicated by the double-headed arrow in FIG. 6). The tensile elongation is usually measured with a sheet of prepreg 1 in the cured state (in Stage C) used as a sample. Alternatively, the sample may also be multiple sheets of prepreg 1 that are stacked one on top of another such that the directions in which their warps 111 extend agree with each other and the directions in which their woofs 112 extend agree with each other, and then cured.

The tensile elongation may be measured by a tensile test conducted in the following manner. First, before the tensile test is conducted, the length ($L_0$) of the sample is measured in a direction that forms a tilt angle of 45 degrees with respect to the warp 111 or the woof 112. In this case, the width of the sample is adjusted to 5 mm. Next, the sample is pulled at a velocity of 5 mm/min in the direction forming a tilt angle of 45 degrees with respect to the warp 111 or the woof 112 using a tensile tester, thereby measuring the length (L) of the sample just before the sample is broken. Then, the tensile elongation may be calculated by the following Equation (2):

[Numerical Expression 5]

$$\text{Tensile elongation (\%)} = \{(L-L_0)/L_0\} \times 100 \qquad (2)$$

The tensile elongation obtained in this manner falling within the range from 5% to less than 30% allows the warpage of the semiconductor package 4 to be further reduced.

(2.5) Manufacturing Method

Even though its resin composition is not particularly limited, a method for producing the prepreg 1 using the suitable resin composition that has been described in Section (2.3.2) will be described.

First of all, a varnish of the resin composition is prepared. At least one of Component (A1) or Component (A2) and Component (B) are added to, and dissolved in, a solvent, and then compounded with an additive and a curing accelerator added thereto as needed, thereby preparing a base varnish. In this case, examples of solvents used for preparation include acetone, ketone solvents such as methyl ethyl ketone and cyclohexanone, aromatic solvents such as toluene and xylene, and nitrogen-containing solvents such as dimethyl formamide.

Next, at least one of Component (C1) or Component (C2) is added to, and dispersed in, the base varnish, thereby preparing a resin composition varnish. At least one of Component (C1) or Component (C2) may be dispersed by a disperser such as a homogenizer, a disper or a beads mill.

Next, the resin composition in the varnish state (in Stage A) is impregnated into the base member 11 and then heated and dried to a semi-cured state (in Stage B), thereby producing the prepreg 1.

(2.6) Intended Use

A prepreg 1 according to this embodiment may be used to fabricate a semiconductor package 4. The semiconductor package 4 does not refer to the test semiconductor package but a semiconductor package actually used as an electronic part of any of various types of electronic circuits. More specifically, the prepreg 1 according to this embodiment may be used as a material for a substrate 3 that forms part of the semiconductor package 4 and as a material for a metal-clad laminate 5 that may be patterned into the substrate 3. In the following description, the process of mounting the chip 2 onto the substrate 3, which is a package substrate, will be hereinafter referred to as "primary mounting" and the process of mounting the semiconductor package 4 onto the printed wiring board 7 as a motherboard (main board) will be hereinafter referred to as "secondary mounting."

[Substrate]

Figure 7A:
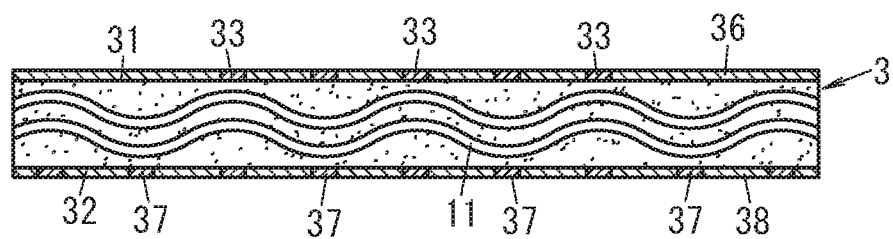
FIG. 7A is a schematic cross-sectional view illustrating a substrate according to the exemplary embodiment of the present disclosure.

FIG. 7A illustrates a substrate 3 according to this embodiment. The substrate 3 is basically as already described in Section (2.2.2). Nevertheless, the shape and dimensions of the substrate 3 are not particularly limited. The substrate 3 may include either only one base member 11 or two or more base members 11, whichever is appropriate.

The first substrate surface 31 of the substrate 3 may be covered with a patterned conductor (conductor wiring) entirely but the pads 33. In this case, the first substrate surface 31 is suitably covered with a solder resist layer 36 entirely but the pads 33. Providing the solder resist layer 36 not only reduces the chances of solder being deposited on unintentional regions other than the pads 33 during the primary mounting process but also protects the patterned conductor (not shown) formed on the first substrate surface 31 from an external environment. Besides, the solder resist layer 36 also contributes to maintaining electrical insulation between the patterned conductors on the first substrate surface 31, thus reducing the short-circuit. Any suitable material may be used for the solder resist layer 36 without limitation.

The substrate 3 further includes, on the second substrate surface 32, a plurality of pads 37 for use in the secondary mounting process. These pads 37 are electrically connected to the pads 33 on the first substrate surface 31. The second substrate surface 32 of the substrate 3 may be covered with a patterned conductor entirely but the pads 37. In this case, the second substrate surface 32 is suitably covered with a solder resist layer 38 entirely but the pads 37. Providing the solder resist layer 38 not only reduces the chances of solder being deposited on unintentional regions other than the pads 37 during the secondary mounting process but also protects the patterned conductor (not shown) formed on the second substrate surface 32 from an external environment. Besides, the solder resist layer 38 also contributes to maintaining electrical insulation between the patterned conductors on the second substrate surface 32, thus reducing the short-circuit. Any suitable material may be used for the solder resist layer 38 without limitation. Optionally, at the time of manufacturing the semiconductor package 4, solder balls 39 may be provided for the respective pads 37 (see FIG. 14A).

In this embodiment, the substrate 3 includes a cured product of the prepreg 1. This prepreg 1 satisfies the relational expression (I). This reduces, even when the chip 2 mounted expands or shrinks due to a temperature variation, the chances of causing significant stress to the chip 2. In other words, this reduces the strain caused to the chip 2 mounted. That is to say, this causes the substrate 3 to expand or shrink accordingly as the chip 2 mounted expands or shrinks.

[Metal-Clad Laminate]

Figure 7B:
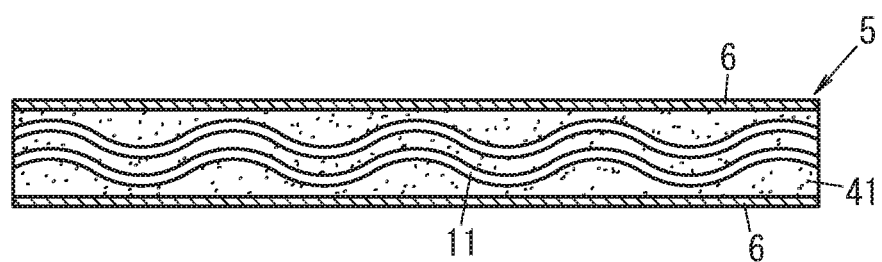
FIG. 7B is a schematic cross-sectional view illustrating a metal-clad laminate according to another exemplary embodiment of the present disclosure.

FIG. 7B illustrates a metal-clad laminate 5 according to this embodiment. This metal-clad laminate 5 includes an insulating layer 41 and a metal layer 6. The insulating layer 41 includes a cured product of the prepreg 1. The metal layer 6 is provided on at least one surface of the insulating layer 41. That is to say, the metal-clad laminate 5 includes a double-sided metal-clad laminate (such as the one shown in FIG. 7B) and a single-sided metal-clad laminate (not shown). Specific examples of the metal layer 6 include a sheet of metal foil. In the following description, a "sheet of metal foil" without any modifier hereinafter refers to, unless otherwise stated, a sheet of metal foil which is thick enough (e.g., about 12 μm) to be handled by itself.

Specifically, when the metal-clad laminate 5 is fabricated, multiple sheets of metal foil may be stacked one on top of another and heated and pressed on one or both sides of a single prepreg 1. Alternatively, two or more prepregs 1 may be stacked one on top of another and multiple sheets of metal foil may be stacked one on top of another and heated and pressed on one or both sides of the stack of prepregs 1. The insulating layer 41 has electrical insulation properties. When heated, the prepreg 1 in the semi-cured state turns into the insulating layer 41 in the cured state as described above. The moisture-heat resistance of the metal-clad laminate 5 is improvable not only when the insulating layer 41 has a thickness less than 0.2 mm but also when the insulating layer 41 has a thickness of 0.2 mm or more. The thickness of the insulating layer 41 of the metal-clad laminate 5 has an upper limit of about 0.4 mm. Copper foil may be used as exemplary metal foil. The stacking and forming processes may be performed under heat and pressure using a multi-stage vacuum press or a double belt process, for example.

A substrate 3 according to this embodiment may be obtained by patterning the metal-clad laminate 5. Specifically, a patterned conductor including pads 33, 37 may be obtained by partially removing the metal layer 6 of the metal-clad laminate 5. In that case, one surface of the insulating layer 41 defines a first substrate surface 31 and the other surface of the insulating layer 41 defines a second substrate surface 32. The patterned conductor may be formed by subtractive method, for example.

Optionally, the metal layer 6 may be configured as ultrathin metal foil (such as ultrathin copper foil) of so-called "ultrathin metal foil with a carrier." The ultrathin metal foil with a carrier has a triple layer structure. Specifically, the ultrathin metal foil with a carrier includes: a carrier; a peelable layer provided on the surface of the carrier; and ultrathin metal foil provided on the surface of the peelable layer. The ultrathin metal foil is too thin to be handled by itself and is naturally thinner than the carrier. The carrier is metal foil (such as copper foil) that plays the role of protecting and supporting the ultrathin metal foil. The ultrathin metal foil with the carrier is thick enough to be handled easily. The thicknesses of the ultrathin metal foil and carrier are not particularly limited. The ultrathin metal foil may have a thickness falling within the range from 1 μm to 5 μm, for example. The carrier may have a thickness falling within the range from 18 μm to 35 μm, for example. The ultrathin metal foil may be peeled as needed off the carrier.

When the ultrathin metal foil with a carrier is used, the metal-clad laminate 5 may be fabricated in the following manner. Specifically, in that case, multiple sheets of ultrathin metal foil with a carrier may be stacked one on top of another and formed into a desired shape on one or both sides of a single prepreg 1. Alternatively, a plurality of prepregs 1 may be stacked one on top of another and multiple sheets of ultrathin metal foil with a carrier may be stacked one on top of another and formed into a desired shape on one or both sides of the stack of prepregs 1. In that case, the ultrathin metal foil of the ultrathin metal foil with a carrier is stacked on the surface of the prepreg 1. After the stacking and forming processes have been performed, the carrier is peeled off the ultrathin metal foil. The ultrathin metal foil has been bonded as the metal layer 6 onto the surface of the insulating layer 41, which is a cured product of the prepreg 1. The peelable layer is suitably peeled along with the carrier so as not to be left on the surface of the ultrathin metal foil. However, even when left there, any fragment of the peelable layer is easily removable. The ultrathin metal foil bonded onto the surface of the insulating layer 41 is usable as a seed layer in a modified semi additive process (MSAP) (see, for example, FIG. 11A). A patterned conductor may be formed by subjecting the seed layer to an electroplating process.

Optionally, the metal layer 6 may be formed on the insulating layer 41 by any of a physical vapor deposition (PVD) process, a chemical vapor deposition (CVD) process, or a liquid phase deposition process (e.g., a plating process such as electroless plating). The metal layer formed in this manner may be used as a seed layer in a semi additive process (SAP).

The width of the patterned conductor (i.e., a fine-line pattern) formed may be reduced in the order of the subtractive process, the semi additive process, and a modified semi additive process. The semi additive method and the modified semi additive method will be described later.

As can be seen, the metal-clad laminate 5 according to this embodiment facilitates making a substrate 3 that expands or shrinks accordingly as the chip 2 mounted expands or shrinks.

Figure 8:
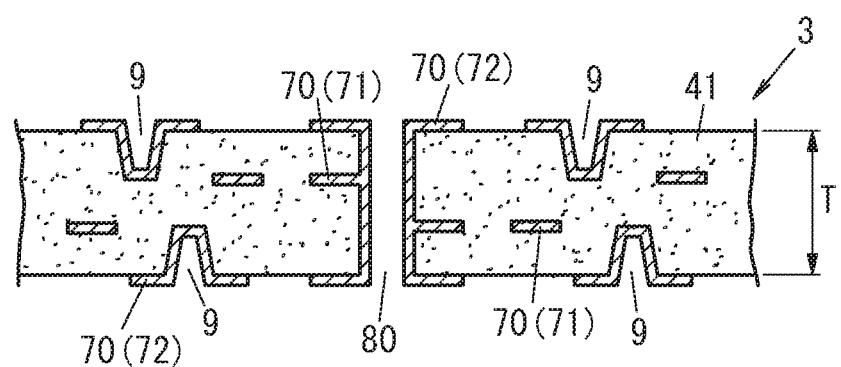
FIG. 8 is a schematic cross-sectional view illustrating a substrate according to still another exemplary embodiment of the present disclosure.

FIG. 8 illustrates another exemplary substrate 3 as a printed wiring board. This substrate 3 is a multilayer printed wiring board, of which the patterned conductor 70 has been formed by the subtractive process and which has a multilayer structure formed by a build-up process. One element, provided inside the insulating layer 41, of the patterned conductor 70 is an internal pattern element 71, and another element, provided on an outer surface of the insulating layer 41, of the patterned conductor 70 is an external pattern element 72. This improves the moisture-heat resistance of the substrate 3 not only when the insulating layer 41 has a thickness T less than 0.2 mm but also when the insulating layer 41 has a thickness T of 0.2 mm or more. The thickness T of the insulating layer 41 of the substrate 3 has an upper limit of about 0.4 mm.

When the patterned conductor 70 is formed, holes are cut through the insulating layer 41 for interconnection purposes. As used herein. "interconnection" refers to making multiple elements in different layers of the patterned conductor 70 electrically conductive with each other. Each of those holes may be a through hole running through the substrate 3 or a blind hole that does not run through the substrate 3. As shown in FIG. 8, a via hole 80 may be formed by plating an inner surface of a through hole, and a blind via hole 9 may be formed by plating an inner surface of a non-through hole. Although not shown, a buried via hole may also be provided. Each hole may have a diameter falling within the range from 0.01 mm to 0.20 mm, for example, and have a depth falling within the range from 0.02 mm to 0.80 mm, for example. The holes may be cut by drilling or laser cutting, for example.

In this case, adding Components (C1) and (C2) as fillers to the insulating layer 41 would reduce the etch depth at the time of the desmear process because the functional group at the end of the aliphatic alkyl group of the silane coupling agents is an isocyanate group, a glycidyl group, an amino group, a methacryloyl group, or a vinyl group. Also, even if any resin smears are left in the holes, the resin smears are further removable from the holes through cleaning of the holes by a type of desmear process such as chemical hole cleaning. This would significantly reduce the chances of electrical conductivity being seriously affected by those resin smears, thus improving the reliability of electrical conduction.

Furthermore, adding Components (C1) and (C2) as fillers to the insulating layer 41 allows the aliphatic alkyl group of the silane coupling agents to serve as a stress relieving layer, thus lowering the elasticity of the substrate 3 while reducing its coefficient of thermal expansion and imparting an excellent elongation property thereto as well. This would further improve the moisture-heat resistance of the substrate 3.

Next, two methods that may be used to form a patterned conductor with the blind via holes 9 will be described. The two methods are the semi additive process (SAP) and the modified semi additive process (MSAP).

First, the SAP will be described with reference to FIGS. 9A-9G.

Figure 9A:
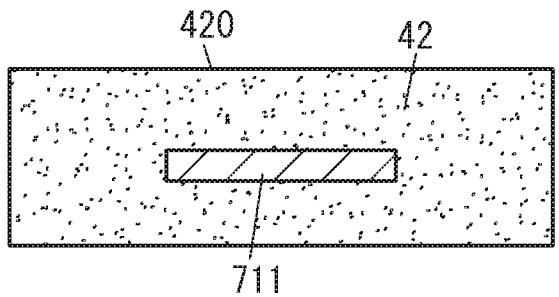
FIGS. 9A-9G are schematic cross-sectional views illustrating a series of process steps of a semi-additive process.

FIG. 9A illustrates an insulating layer 42 including an internal pattern element 711 inside and having a principal surface 420 outside.

Figure 9B:
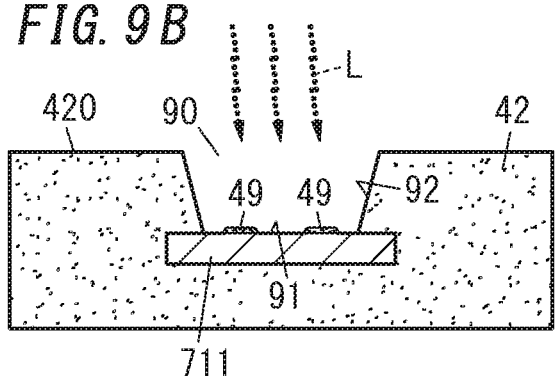

First of all, a non-through hole 90 is formed by cutting a hole halfway through the insulating layer 42 as shown in FIG. 9B. The hole may be formed by laser cutting, for example. Specific examples of the laser beam L include a $CO_2$ laser beam and a UV-YAG laser beam. The non-through hole 90 is cut open through the principal surface 420 of the insulating layer 42. The bottom 91 of the non-through hole 90 is the surface of the internal pattern element 711. While the hole is being cut, resin smears 49 are produced and deposited on the surface of the internal pattern element 711 that is the bottom 91 of the non-through hole 90.

Figure 9C:
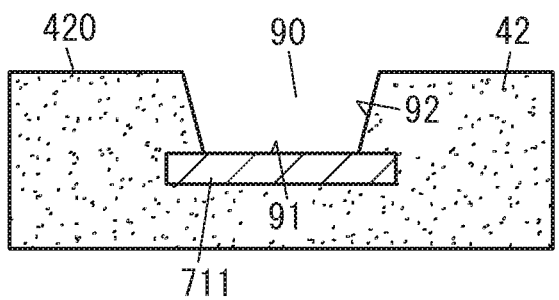

Next, to remove the resin smears 49, a desmear process is carried out as shown in FIG. 9C. The desmear process makes the principal surface 420 of the insulating layer 42 and an inner side surface 92 and bottom 91 of the non-through hole 90 roughened, and also allows the resin smears 49 to be removed from the bottom 91 and inner side surface 92 of the non-through hole 90.

Figure 9D:
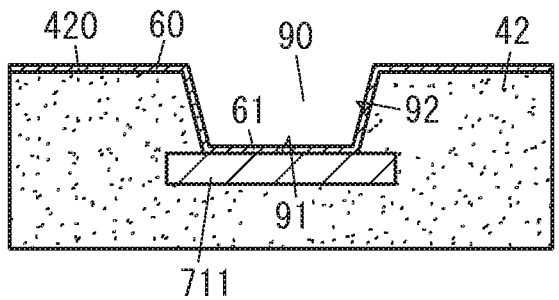

Thereafter, as shown in FIG. 9D, the principal surface 420 of the insulating layer 42 and the bottom 91 and inner side surface 92 of the non-through hole 90 are subjected to an electroless plating process, thereby forming an electroless plating layer 61 that will be a seed layer 60.

Figure 9E:
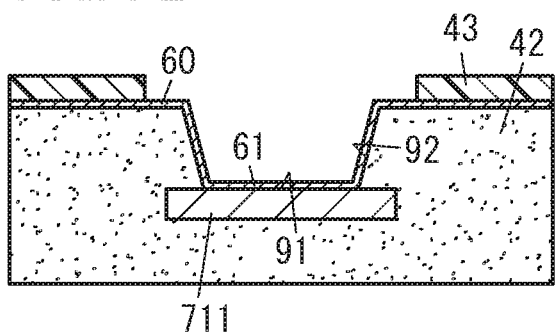

Subsequently, as shown in FIG. 9E, a plating resist mask 43 is formed on the principal surface 420 of the insulating layer 42. The plating resist mask 43 masks portions, which will not be covered with an external pattern element 721, of the principal surface 420 of the insulating layer 42.

Figure 9F:
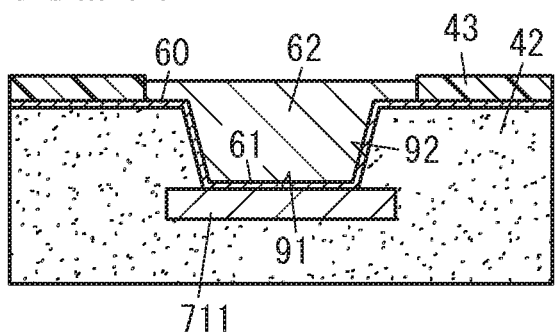

Then, as shown in FIG. 9F, an electroplating process is carried out to fill those portions, not masked with the plating resist mask 43, with a plating metal 62.

Figure 9G:
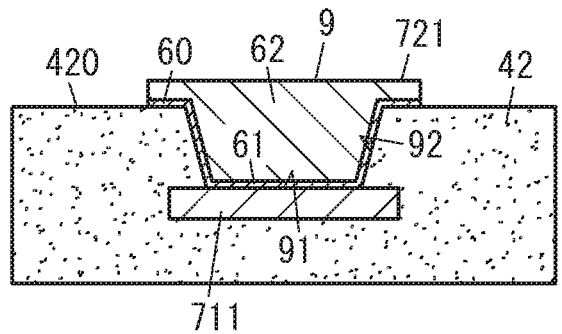

Thereafter, as shown in FIG. 9G, the plating resist mask 43 is removed and a portion, interposed between the plating resist mask 43 and the principal surface 420 of the insulating layer 42, of the seed layer 60 is etched away. In this manner, a blind via hole 9, which electrically connects the internal pattern element 711 to the external pattern element 721, is formed. In particular, the blind via hole 9 is filled with the plating metal 62, and therefore, is also called a "filled via."

Figure 10A:
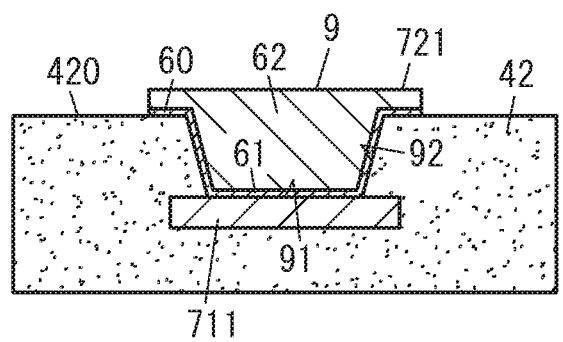
FIG. 10A is a schematic cross-sectional view illustrating a condition where no resin smears are left between an internal pattern and a plating after the semi-additive process has been carried out.
Figure 10B:
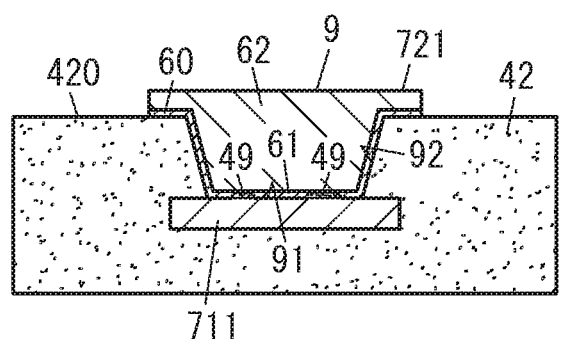
FIG. 10B is a schematic cross-sectional view illustrating a condition where some resin smears are left between the internal pattern and the plating after the semi-additive process has been carried out.

In this case, if the insulating layer 42 contains neither Component (C1) nor Component (C2) as a filler, a filled via may be formed with some resin smears 49 left between the internal pattern element 711 and the electroless plating layer 61 as shown in FIG. 10B after the SAP has been carried out. These resin smears 49 are residual ones that have not been removed even by the desmear process. Leaving such resin smears 49 would cause conduction failures due to the resin smears 49, thus possibly affecting the reliability of electrical conduction.

In contrast, if the insulating layer 42 contains both of Components (C1) and (C2) as fillers, a filled via may be formed with no resin smears 49 left between the internal pattern element 711 and the electroless plating layer 61 as shown in FIG. 10A after the SAP has been carried out. That is to say, the resin smears 49 are easily removable by the desmear process. This would significantly reduce the chances of electrical conductivity being seriously affected by the resin smears 49, thus improving the reliability of electrical conduction. Note that the phrase "no resin smears 49 left" refers herein to not only a situation where literally no resin smears 49 are left at all but also a situation where very few resin smears 49 are left to the point of hardly affecting the reliability of electrical conduction.

Next, the MSAP will be described with reference to FIGS. 11A-11G.

FIG. 11A illustrates an insulating layer 42 including an internal pattern element 711 inside and having a principal surface 420 outside. The principal surface 420 is covered with ultrathin metal foil 63 that will be a first seed layer 601.

First of all, a non-through hole 90 is formed by cutting a hole halfway through the insulating layer 42, as well as through the first seed layer 601, as shown in FIG. 11B. The hole may be formed by laser cutting, for example. Specific examples of the laser beam L include a $CO_2$ laser beam and a UV-YAG laser beam. The non-through hole 90 is cut open through the principal surface 420 of the insulating layer 42. The bottom 91 of the non-through hole 90 is the surface of the internal pattern element 711. While the hole is being cut, resin smears 49 are produced and deposited on the surface of the internal pattern element 711 that is the bottom 91 of the non-through hole 90.

Next, to remove the resin smears 49, a desmear process is carried out as shown in FIG. 11C. The desmear process makes the first seed layer 601 on the principal surface 420 of the insulating layer 42 and an inner side surface 92 and bottom 91 of the non-through hole 90 roughened, and also allows the resin smears 49 to be removed from the bottom 91 and inner side surface 92 of the non-through hole 90.

Thereafter, as shown in FIG. 11D, the first seed layer 601 on the principal surface 420 of the insulating layer 42 and the bottom 91 and inner side surface 92 of the non-through hole 90 are subjected to an electroless plating process, thereby forming an electroless plating layer 61 that will be a second seed layer 602.

Subsequently, as shown in FIG. 11E, a plating resist mask 43 is formed on the principal surface 420 of the insulating layer 42. The plating resist mask 43 masks portions, which will not be covered with an external pattern element 721, of the principal surface 420 of the insulating layer 42.

Then, as shown in FIG. 11F, an electroplating process is carried out to fill those portions, not masked with the plating resist mask 43, with a plating metal 62.

Thereafter, as shown in FIG. 11G, the plating resist mask 43 is removed and portions, interposed between the plating resist mask 43 and the principal surface 420 of the insulating layer 42, of the first and second seed layers 601 and 602 are etched away. In this manner, a blind via hole 9, which electrically connects the internal pattern element 711 to the external pattern element 721, is formed. In particular, the blind via hole 9 is filled with the plating metal 62, and therefore, is sometimes called a "filled via."

Figure 12A:
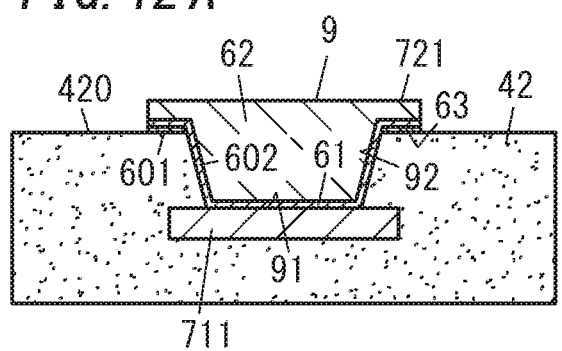
FIG. 12A is a schematic cross-sectional view illustrating a condition where no resin smears are left between an internal pattern and a plating after the modified semi-additive process has been carried out.
Figure 12B:
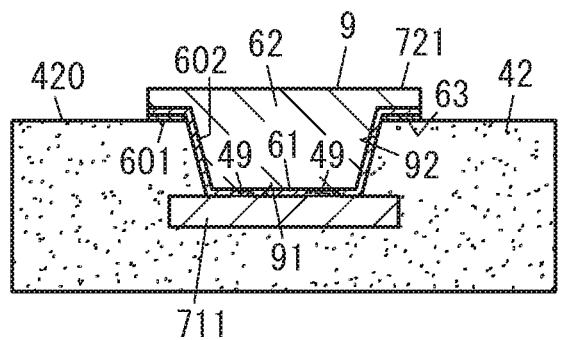
FIG. 12B is a schematic cross-sectional view illustrating a condition where some resin smears are left between the internal pattern and the plating after the modified semi-additive process has been carried out.

If the insulating layer 42 contains neither Component (C1) nor Component (C2) as a filler, a filled via may be formed with some resin smears 49 left between the internal pattern element 711 and the electroless plating layer 61 as shown in FIG. 12B after the MSAP has been carried out. These resin smears 49 are residual ones that have not been removed even by the desmear process. Leaving such resin smears 49 would cause conduction failures due to the resin smears 49, thus possibly affecting the reliability of electrical conduction.

In contrast, if the insulating layer 42 contains both of Components (C1) and (C2) as fillers, a filled via may be formed with no resin smears 49 left between the internal pattern element 711 and the electroless plating layer 61 as shown in FIG. 12A after the MSAP has been carried out. That is to say, the resin smears 49 are easily removable by the desmear process. This would significantly reduce the chances of electrical conduction being seriously affected by the resin smears 49, thus improving the reliability of electrical conduction. Note that the phrase "no resin smears 49 left" refers herein to not only a situation where literally no resin smears 49 are left at all but also a situation where very few resin smears 49 are left to the point of hardly affecting the reliability of electrical conduction.

[Semiconductor Package]

The semiconductor package 4 according to this embodiment is basically as already described in Section (2.2.3). Specifically, the semiconductor package 4 includes the chip 2 and the substrate 3. The chip 2 is mounted on the substrate 3. In this case, the semiconductor package 4 does not refer to the test semiconductor package but a semiconductor package actually used as an electronic part of any of various types of electronic circuits. Therefore, the chip 2 that forms part of the semiconductor package 4 is not a test chip such as a TEG chip, either. The shape and dimensions of the semiconductor package 4 are not particularly limited.

Figure 13A:
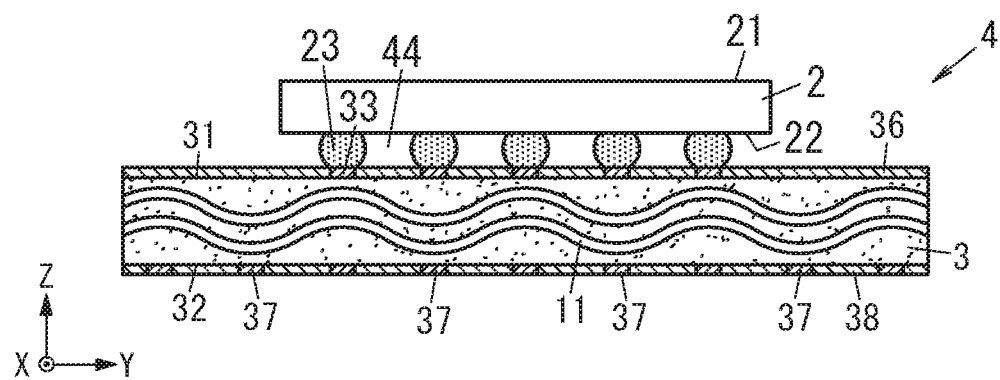
FIG. 13A is a schematic cross-sectional view illustrating a semiconductor package according to an exemplary embodiment of the present disclosure.
Figure 13B:
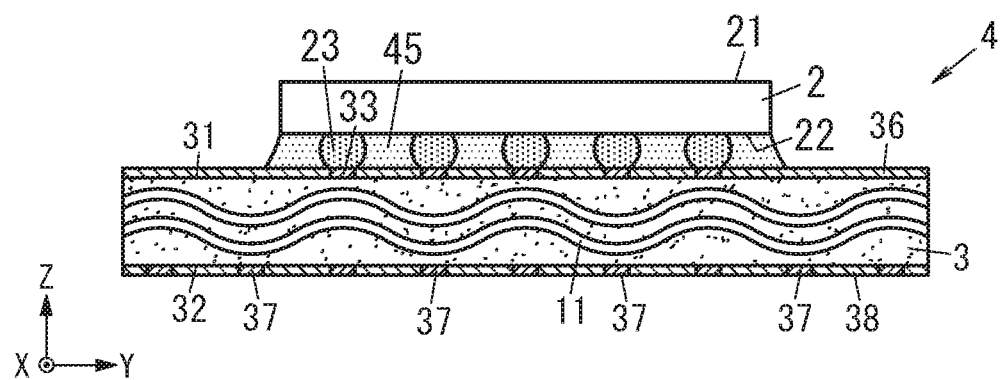
FIG. 13B is a schematic cross-sectional view illustrating a semiconductor package according to another exemplary embodiment of the present disclosure.

FIGS. 13A and 13B illustrate exemplary semiconductor packages 4. In the semiconductor package 4 shown in FIG. 13A, a gap 44 is left between the chip 2 and the substrate 3. This is certainly an option, but an underfill resin layer 45 may be formed by filling the gap 44 with an underfill resin as shown in FIG. 13B. Providing the underfill resin layer 45 further reduces a mismatch in coefficient of thermal expansion between the chip 2 and the substrate 3. Any material with electrical insulation properties may be used as the underfill resin.

In this example, the substrate 3 includes a cured product of the prepreg 1. This prepreg 1 satisfies the relational expression (I). This reduces, even when the chip 2 mounted expands or shrinks due to a temperature variation, the chances of causing significant stress to the chip 2. In other words, this reduces the strain caused to the chip 2 mounted. That is to say, this causes the substrate 3 to expand or shrink accordingly as the chip 2 mounted expands or shrinks. This reduces the warpage of the semiconductor package 4. In addition, since no significant stress is caused to the chip 2 mounted, the thickness of the substrate 3 is reducible as well. This contributes to reduction in the thickness of the semiconductor package 4 with reduced warpage.

A specific example of the semiconductor package 4 may be a fine pitch ball grid array (FBGA), for example. Optionally, using the semiconductor package 4 as a sub-package and stacking multiple sub-packages one on top of another also allows a package such as a package on package (PoP) to be fabricated. As can be seen, this embodiment allows various types of packages to be fabricated. In any of these packages, using the suitable materials described above allows Components (A1), (A2), and (B) to not only reduce the warpage but also improve the moisture-heat resistance as well. That is to say, Components (A1) and (A2) increase the rigidity and Component (B) decreases the elasticity and relieves the stress, thus reducing the warpage of any type of packages generally without depending on the type of the package. In addition. Components (A1), (A2), and (B) improve the moisture-heat resistance of the package as well.

[Printed Circuit Board]

Figure 14A:
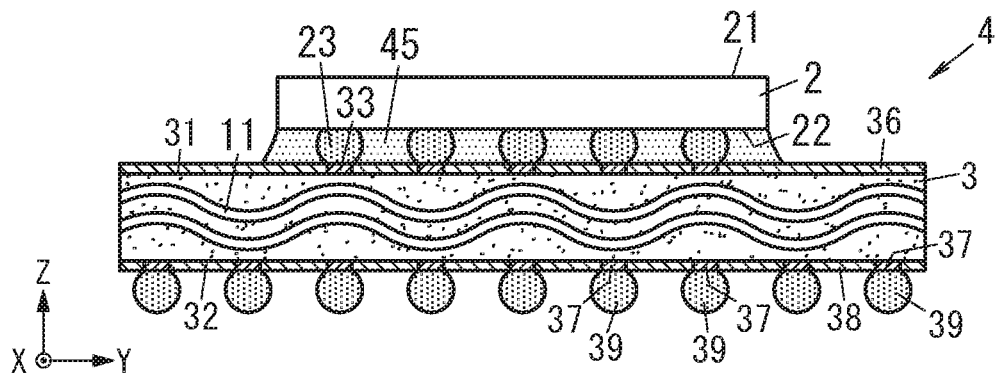
FIG. 14A is a schematic cross-sectional view illustrating a semiconductor package for use in a printed circuit board according to an exemplary embodiment of the present disclosure.
Figure 14B:
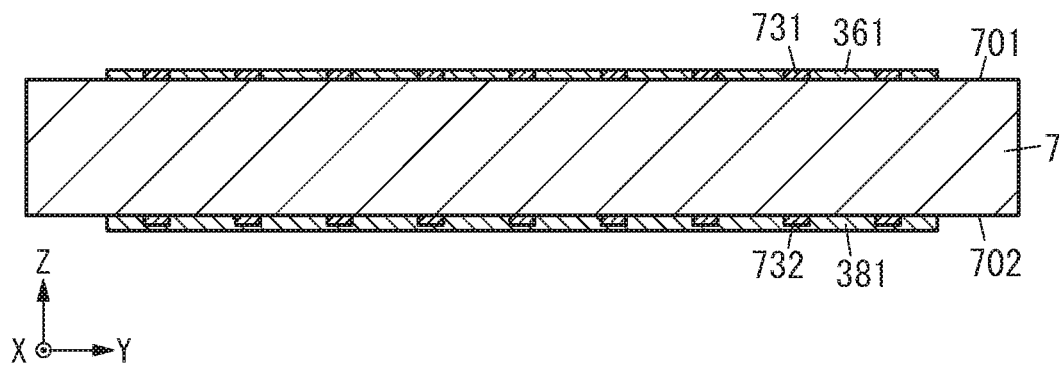
FIG. 14B is a schematic cross-sectional view illustrating a printed wiring board for use in the printed circuit board according to the exemplary embodiment of the present disclosure.
Figure 14C:
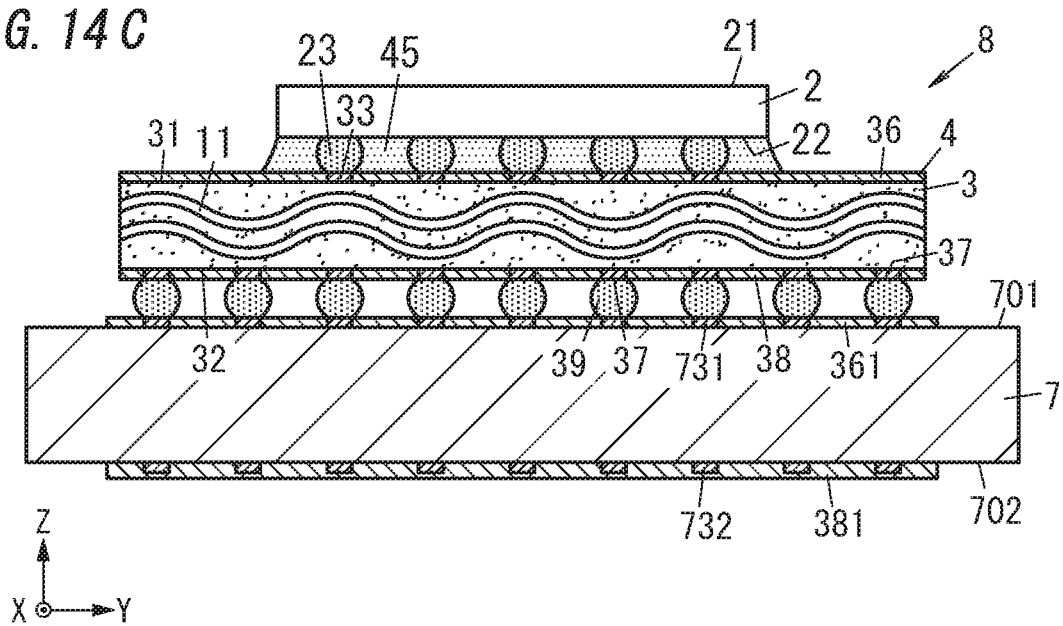
FIG. 14C is a schematic cross-sectional view illustrating the printed circuit board according to the exemplary embodiment of the present disclosure.

As shown in FIG. 14C, a printed circuit board 8 according to this embodiment includes a semiconductor package 4 and a printed wiring board 7. The semiconductor package 4 is mounted on the printed wiring board 7. The semiconductor package 4 for use to fabricate the printed circuit board 8 is shown in FIG. 14A, and the printed wiring board 7 is shown in FIG. 14B.

In the semiconductor package 4 shown in FIG. 14A, solder balls 39 are provided for the respective pads 37 for the purpose of the secondary mounting process.

A general-purpose printed wiring board may be used as the printed wiring board 7 shown in FIG. 14B. The printed wiring board 7 may be fabricated using the prepreg 1 according to this embodiment. The printed wiring board 7 has a first wiring surface 701 and a second wiring surface 702. The first wiring surface 701 and the second wiring surface 702 respectively define the principal surface and back surface of the printed wiring board 7. The thickness of the printed wiring board 7 (i.e., distance between the first wiring surface 701 and the second wiring surface 702) is not particularly limited.

The printed wiring board 7 includes a plurality of pads 731 for the purpose of the secondary mounting process. The plurality of pads 731 are formed on the first wiring surface 701. Specifically, the respective locations of the plurality of pads 731 correspond one to one to the respective locations of the solder balls 39 on the semiconductor package 4.

The first wiring surface 701 of the printed wiring board 7 may be covered with a patterned conductor entirely but the pads 731. In this case, the first wiring surface 701 is suitably covered with a solder resist layer 361 entirely but the pads 731. Providing the solder resist layer 361 not only reduces the chances of solder being deposited on unintentional regions other than the pads 731 during the secondary mounting process but also protects the patterned conductor (not shown) formed on the first wiring surface 701 from an external environment. Besides, the solder resist layer 361 also contributes to maintaining electrical insulation between respective elements of the patterned conductor on the first wiring surface 701, thus reducing the short-circuit. Any suitable material may be used for the solder resist layer 361 without limitation.

The printed wiring board 7 may include a patterned conductor 732 on the second wiring surface 702 as well. In that case, the second wiring surface 702 is suitably covered with a solder resist layer 381. Providing the solder resist layer 381 protects the patterned conductor 732 from an external environment. Besides, the solder resist layer 381 also contributes to maintaining electrical insulation between respective elements of the patterned conductor 732, thus reducing the short-circuit. Any suitable material may be used for the solder resist layer 381 without limitation.

The semiconductor package 4 is mounted onto the printed wiring board 7. Specifically, the semiconductor package 4 is mounted onto the printed wiring board 7 by bonding the solder balls 39 on the semiconductor package 4 onto the pads 731 on the printed wiring board 7 by soldering. In this case, the substrate 3 of the semiconductor package 4 serves as an interposer and the printed wiring board 7 serves as a motherboard.

In this example, the printed circuit board 8 is fabricated using, as a material, the prepreg 1 that satisfies the relational expression (I) described above. Thus, as shown in FIGS. 15A and 15B, parts, located around the chip 2, of the entire substrate 3 do not go against, but follow, the behavioral pattern of the chip 2 in this printed circuit board 8. That is to say, as the chip 2 expands or shrinks, the substrate 3 also expands or shrinks accordingly. This reduces the chances of causing significant stress to the bonding region (i.e., the region including the bumps 23) between the chip 2 and the substrate 3, thus ensuring sufficient reliability of connection for the printed circuit board 8.

Furthermore, if the printed circuit board 8 is fabricated using, as a material, the prepreg 1 that satisfies the relational expressions (I) and (II) described above, then parts, located around the printed wiring board 7, of the entire substrate 3 do not go against, but follow, the behavioral pattern of the printed wiring board 7 in this printed circuit board 8 as shown in FIGS. 15A and 15B. That is to say, as the printed wiring board 7 expands or shrinks, the substrate 3 also expands or shrinks accordingly. This reduces the chances of causing significant stress to the bonding region (i.e., the region including the solder balls 39) between the substrate 3 and the printed wiring board 7, thus ensuring sufficient reliability of connection for the printed circuit board 8.

[Resume]

As can be seen from the foregoing description of exemplary embodiments, the present disclosure has the following aspects. In the following description, reference signs are added in parentheses to the respective constituent elements solely for the purpose of clarifying the correspondence between those aspects of the present disclosure and the exemplary embodiments described above.

A prepreg (1) according to a first aspect is used to fabricate a semiconductor package (4) including a chip (2) and a substrate (3) to mount the chip (2) thereon. The prepreg (1) is in a semi-cured state. The substrate (3) includes a cured product of the prepreg (1). The chip (2) has: a first chip surface (21) located opposite from the substrate (3); and a second chip surface (22) located opposite from the first chip surface (21). The prepreg (1) satisfies the following relational expression (I):

[Numerical Expression 6]

$$0.9 \leq X_2/X_1 \leq 1.0 \quad (I)$$

where $X_1$ is a coefficient of thermal expansion of the first chip surface (21) of the chip (2) before the chip (2) is mounted on the substrate (3), and $X_2$ is a coefficient of thermal expansion of the first chip surface (21) of the chip (2) after the chip (2) has been mounted on the substrate (3).

This configuration reduces, even when the chip (2) mounted expands or shrinks due to a temperature variation, the chances of causing significant stress to the chip (2), thus reducing the warpage of the semiconductor package (4).

In a prepreg (1) according to a second aspect, which may be implemented in conjunction with the first aspect, the substrate (3) has: a first substrate surface (31) to mount the chip (2) thereon; and a second substrate surface (32) located opposite from the first substrate surface (31). The prepreg (1) satisfies the following relational expression (II):

[Numerical Expression 7]

$$1.05 \leq Y_1/Y_2 \leq 2.00 \quad (II)$$

where $Y_1$ is a coefficient of thermal expansion of a region (35) on the second substrate surface (32) before the chip (2) is mounted on the first substrate surface (31), the region (35) on the second substrate surface (32) being located opposite from a region (34) on the first substrate surface (31) on which the chip (2) is to be mounted, and $Y_2$ is a coefficient of thermal expansion of the region (35) on the second substrate surface (32) after the chip (2) has been mounted on the first substrate surface (31), the region (35) on the second substrate surface (32) being located opposite from the region (34) on the first substrate surface (31) on which the chip (2) has been mounted.

This configuration ensures reliability of connection even when the chip (2) and printed wiring board (7) expand or shrink due to a temperature variation in the printed circuit board (8).

A prepreg (1) according to a third aspect, which may be implemented in conjunction with the first or second aspect, includes: a base member (11); and a semi-cured product (12) of a resin composition impregnated into the base member (11).

This configuration increases the chances of satisfying the relational expressions (I) and (II).

In a prepreg (1) according to a fourth aspect, which may be implemented in conjunction with the third aspect, the base member (11) includes a woven fabric in which a warp (111) and a woof (112) have been woven substantially perpendicularly to each other. A cured product of the prepreg (1) has a tensile elongation falling within the range from 5% to less than 30% in a direction that forms a tilt angle of 45 degrees with respect to either the warp (111) or the woof (112).

This configuration further reduces the warpage of the semiconductor package (4).

In a prepreg (1) according to a fifth aspect, which may be implemented in conjunction with the third or fourth aspect, the resin composition includes at least one resin selected from the group consisting of epoxy resins, phenolic resins, imide resins, cyanate ester resins, acrylic resins, and vinyl ester resins.

This configuration increases the chances of obtaining a prepreg (1) that satisfies the relational expressions (I) and (II).

A substrate (3) according to a sixth aspect includes a cured product of the prepreg (1) according to any one of the first to fifth aspects.

This configuration allows the substrate (3) to expand or shrink as the chip (2) mounted expands or shrinks.

A metal-clad laminate (5) according to a seventh aspect includes: an insulating layer (41); and a metal layer (6) provided on at least one surface of the insulating layer (41). The insulating layer (41) includes a cured product of the prepreg (1) according to any one of the first to fifth aspects.

This configuration facilitates manufacturing a substrate (3) that expands or shrinks accordingly as the chip (2) mounted expands or shrinks.

A semiconductor package (4) according to an eighth aspect includes: a chip (2); and a substrate (3) to mount the chip (2) thereon. The substrate (3) includes a cured product of the prepreg (1) according to any one of the first to fifth aspects.

This configuration reduces, even when the chip (2) mounted expands or shrinks due to a temperature variation, the chances of causing significant stress to the chip (2), thus reducing the warpage of the semiconductor package (4). In addition, causing no significant stress to the chip (2) mounted allows the thickness of the substrate (3) to be reduced as well, thus contributing to reduction in the thickness of a semiconductor package (4) with reduced warpage.

A printed circuit board (8) according to a ninth aspect includes: the semiconductor package (4) according to the eighth aspect; and a printed wiring board (7) to mount the semiconductor package (4) thereon.

This configuration ensures reliability of connection for the printed circuit board (8).

Examples

Next, the present disclosure will be described specifically by way of specific examples.

<Varnish Composition>

Component (A1):

Naphthalene skeleton containing epoxy resin (HPC-9500P manufactured by DIC Corporation);

Biphenyl skeleton containing epoxy resin (NC-3000 manufactured by Nippon Kayaku Co., Ltd.); and Triphenylmethane skeleton containing epoxy resin (EPPN-502H manufactured by Nippon Kayaku Co., Ltd.)

Component (A2):

Naphthalene skeleton containing phenolic resin (HPC-9500P manufactured by DIC Corporation);

Phenol novolac resin (TD-2090 manufactured by DIC Corporation); and

Phosphorus-modified phenolic resin (HPC-9100 manufactured by DIC Corporation)

Component (B):

Epoxy-modified acrylic resin (PASR-001 manufactured by Nagase ChemteX Corporation)

This component has structures expressed by Formulae (b1), (b2), and (b3), has no unsaturated bonds between adjacent carbon atoms, and has a weight average molecular weight of 500,000, and an epoxy value of 0.21 eq/kg.

Component (C1)

Epoxy silane treated silica

This component is a spherical silica (SC2500SEJ manufactured by Admatecs) subjected to surface treatment with 3-glycidoxypropyltrimethoxy silane and has a mean particle size of 0.5 μm (=500 nm).

Component (C2)

Methacrylic silane treated silica

This component is a spherical silica (YA050C-MJE manufactured by Admatecs) subjected to surface treatment with 3-methacryloxypropyltrimethoxy silane and has a mean particle size of 50 nm.

(Other Resin Components)

Phenylmethane maleimide (BMI-2300 manufactured by Daiwa Kasei Industry Co., Ltd.)

(Modifier)

Core-shell rubber (SRK200A manufactured by Mitsubishi Chemical Corporation)

This is a core-shell type modifier in which a graft layer is provided outside particular rubber (silicone-acrylic composite rubber)

(Curing Accelerator)

2-ethyl-4-methyl imidazole (2E4MZ manufactured by Shikoku Chemicals Corporation)

(Solvent)

Methyl ethyl ketone

<Prepreg>

Components (A1), (A2), and (B) and other resin components were added to, and dissolved in, a solvent to have the compositions (parts by mass) shown in Table 1. Thereafter, a curing accelerator and a modifier were added to the mixture and compounded together. Next, Components (C1) and (C2) were added thereto and allowed to be dispersed in the mixture to prepare a varnish of a resin composition. In Examples 1 and 2, Components (A1) and (A2) and Component (B) had a phase-separated structure without exhibiting compatibility. In Example 3. Components (A2) and (B) had a phase-separated structure without exhibiting compatibility.

Next, the varnish of the resin composition was impregnated into a woven fabric base (glass cloth 2116 manufactured by Nitto Boseki Co., Ltd.) and heated and dried at 130° C. for 5 minutes to a semi-cured state, thereby fabricating a prepreg with a thickness of 100 μm.

<Metal-Clad Laminate>

Two prepregs with such a structure were stacked one on top of the other and copper foil (with a thickness of 12 μm) was stacked as metal foil on each of the two surfaces of the stack. Then, the assembly was heated at 220° C. for 60 minutes and formed into a desired shape with a pressure of 3 MPa applied thereto in a vacuum, thereby fabricating a copper-clad laminate (CCL) as a metal-clad laminate. The insulating layer of the metal-clad laminate had a thickness of 200 μm.

<Substrate>

A mounting region (with dimensions of 15.06 mm×15.06 mm) was defined by partially etching away the sheet of metal foil from one surface of the metal-clad laminate, and a substrate (with dimensions of 35 mm×35 mm) was made by entirely etching away the sheet of metal foil from the other surface thereof (see FIG. 5C). The surface with the mounting region of the substrate is the first substrate surface, and the other surface thereof is the second substrate surface. The mounting region is located at the center of the first substrate surface. The mounting region is divided into nine square blocks in total, i.e., 3 blocks (in the X-axis direction)×3 blocks (in the Y-axis direction). In each of these blocks, a plurality of circular pads are arranged parallel to the X-axis direction and the Y-axis direction. Each block has a pad pitch of 200 μm. An interval between two adjacent blocks is 100 μm. Each pad has a pad diameter of 120 μm. The number of pads per block is 484 (=22×22).

<Semiconductor Package>

Besides the substrate, a chip (FC200SCJYLF manufactured by Waltz Co., Ltd.; dimensions: 15.06 mm×15.06 mm) was also provided. The second chip surface of the chip was divided into nine square blocks, i.e., 3 blocks (in the X-axis direction)×3 blocks (in the Y-axis direction) (see FIG. 5B). In each of these blocks, a plurality of bumps are arranged parallel to the X-axis direction and the Y-axis direction. Each block has a bump pitch of 200 μm. Each bump has a bump diameter of 100 μm. The number of bumps per block is 484 (=22×22). Each bump is made of SAC305. The surface opposite from the second chip surface is the first chip surface. The chip has a thickness of 160 μm.

Then, a semiconductor package was fabricated in the following manner. First of all, the substrate was fixed on a glass plate. Next, flux was applied onto the pads on the substrate, and then a chip was mounted onto the mounting region thereof. Subsequently, the glass plate was put on a hot plate, heated at 260° C. for five minutes, and then cooled to room temperature to bond the bumps and the pads together. In this manner, the chip was mounted onto the substrate. Thereafter, the flux was washed away and dried at 120° C. for one hour. In this manner, a semiconductor package was fabricated. Note that the coefficients of thermal expansion of the first chip surface of the chip and a corresponding region on the second substrate surface of the substrate were measured before and after the chip was mounted onto the substrate. The corresponding region is located right behind the mounting region.

TABLE 1

| | | Product No. | Manufacturer | Specific material | Ex. 1 | Ex.2 | Ex. 3 | Cmp. Ex. 1 |
|---|---|---|---|---|---|---|---|---|
| Varnish composition | Component (A1) | HP-9500 | DIC | Naphthalene skeleton containing epoxy resin | 40 | 0 | 0 | 0 |
| | | NC-3000 | Nippon Kayaku | Biphenyl skeleton containing epoxy resin | 0 | 40 | 0 | 0 |
| | | EPPN-502H | Nippon Kayaku | Triphenyl methane skeleton containing epoxy resin | 0 | 0 | 0 | 43 |
| | Component (A2) | HPC-9500P | DIC | Naphthalene skeleton containing phenolic resin | 30 | 15 | 0 | 0 |
| | | TD-2090 | DIC | Phenol novolac resin | 0 | 0 | 24 | 27 |
| | | HPC-9100 | DIC | Phosphorus-modified phenolic resin | 0 | 10 | 0 | 0 |
| | Component (B) | PASR-001 | Nagase ChemteX | Acrylic resin with Mw of 500,000 | 30 | 15 | 30 | 9 |
| | Component (C1) | SC2500SEJ | Admatecs | Epoxy silane treated silica | 50 | 50 | 0 | 50 |
| | Component (C2) | YA050-MJE | Admatecs | Methacrylic silane treated silica | 3 | 0 | 0 | 0 |
| | Other resin components | BMI-2300 | Daiwa Kasei | Phenylmethane maleimide | 0 | 0 | 46 | 0 |
| | Modifier | SRK200A | Mitsubishi Chemical | Core-shell rubber | 0 | 15 | 0 | 21 |
| | Curing accelerator | 2E4MZ | Shikoku Chemicals | 2-ethyl-4-methyl imidazole | 0.08 | 0.1 | 0.1 | 0.08 |
| | Solvent | MEK | | Methyl ethyl ketone | 150 | 150 | 150 | 150 |

(Evaluation of Physical Properties)

The following physical properties were evaluated. The results are shown in Table 2.

(Coefficient of Thermal Expansion (CTE))

The coefficient of thermal expansion ($X_1$) of the first chip surface of the chip yet to be mounted and coefficient of thermal expansion ($X_2$) of the first chip surface of the chip mounted were calculated using a 3D heated surface shape measuring tool (TherMoiré PS200 manufactured by Akrometrix Corporation) and their ratio ($X_2/X_1$) was obtained. In the same way, the coefficients of thermal expansion ($Y_1$ and $Y_2$) of the corresponding region of the substrate before and after mounting were calculated and their ratio ($Y_1/Y_2$) was obtained.

More specifically, the first chip surface of the chip yet to be mounted was subjected to an operation of increasing its temperature from 50° C. to 260° C. at a rate of 20° C./min and then decreasing its temperature from 260° C. to 50° C. at a rate of 15° C./min twice, and the coefficient of thermal expansion (CTE) was calculated by the following Equation (3) based on data about the strain when the temperature was increased from 50° C. to 220° C. for the second time. Note that since the bumps have a melting point of 217° C. the CTE was calculated up to 220° C.:

[Numerical Expression 8]

$$CTE = exx(220) - exx(50)/170 \quad (3)$$

exx(50): strain in X-axis direction at 50° C.
exx(220): strain in X-axis direction at 220° C.

Note that the numerical value 170 as the denominator of Equation (3) represents the temperature variation (220–50).

The coefficient of thermal expansion of the first chip surface of the chip mounted, and the coefficients of thermal expansion of the corresponding region of the substrate before and after mounting were calculated in the same way.

(Warpage of Semiconductor Package)

Next, the warpage of the semiconductor package was measured by using a 3D heated surface shape measurement tool (TherMoiré PS200 manufactured by Akrometrix Corporation) based on the shadow moiré measurement theory. The warpage of the semiconductor package was obtained as the difference between the maximum and minimum values of coplanarity when the semiconductor package was heated from room temperature (of about 30° C.) to 220° C. and then cooled to 25° C.

(Peak Top Temperature at which Dielectric Loss Tangent Tan δ≥0.05)

An unclad plate with a thickness of 0.2 mm was obtained by etching away the metal foil from both surfaces of the metal-clad laminate. The unclad plate was cut out into a strip with a width of 5 mm in a biasing direction forming a tilt angle of 45 degrees with respect to the warp direction of the woven fabric base, thereby obtaining a sample with a length of 25 mm. This sample was subjected to a dynamic mechanical analysis (DMA) using a dynamic mechanical spectrometer (DMS6100 manufactured by SII Nanotechnology Inc.) under the condition including a chucking interval of 10 mm, a temperature increase rate of 5° C./min, and a tensile mode adopted. A peak top temperature at which tan δ≥0.05 was determined by reading a dielectric loss tangent (tan δ) chart thus obtained by this measurement.

(Modulus of Elasticity)

A storage modulus of elasticity (E') at 25° C. was read from the dielectric loss tangent (tan δ) chart obtained by the measurement and regarded as the modulus of elasticity of the sample.

(Tensile Elongation)

An unclad plate with a thickness of 0.2 mm was obtained by etching away the metal foil from both surfaces of the metal-clad laminate. The unclad plate was cut out into a strip with a width of 5 mm in a biasing direction forming a tilt angle of 45 degrees with respect to the warp direction of the woven fabric base, thereby obtaining a sample with a length of 80 mm. This sample was subjected to a tensile test using a tensile tester (Autograph AGS-X manufactured by Shimadzu Corporation) under the condition including standard distances of 60 mm/min and 5 mm/min. The tensile elongation was calculated by the following equation (2) using an initial sample length ($L_0$) before the tensile test and its length (L) just before the sample was broken at the tensile test:

[Numerical Expression 9]

$$\text{Tensile elongation (\%)} = \{(L - L_0)/L_0\} \times 100 \quad (2)$$

TABLE 2

| | | Measuring method | Measuring condition | Unit | Ex. 1 | Ex. 2 | Ex. 3 | Cmp. Ex. 1 |
|---|---|---|---|---|---|---|---|---|
| Evaluation of physical properties | CTE ($X_1$) of chip yet to be mounted | DIC | 50-220° C. | ppm/° C. | 2.7 | 2.7 | 2.7 | 2.7 |
| | CTE, ($X_2$) of chip mounted | DIC | 50-220° C. | ppm/° C. | 2.6 | 2.6 | 3.6 | 2.3 |
| | Ratio ($X_2/X_1$) of CTE ($X_2$) of chip mounted to CTE ($X_1$) of chip yet to be mounted | — | — | — | 0.96 | 0.96 | 1.33 | 0.85 |
| | CTE ($Y_1$) of substrate before mounting | DIC | 50-220° C. | ppm/° C. | 6.1 | 12.2 | 5.8 | 8.4 |
| | CTE ($Y_2$) of substrate after mounting | DIC | 50-220° C. | ppm/° C. | 5.4 | 10.7 | 5.2 | 9.4 |
| | Ratio ($Y_1/Y_2$) of CTE ($Y_1$) of substrate before mounting to CTE ($Y_2$) of substrate after mounting | — | — | — | 1.13 | 1.14 | 1.12 | 0.89 |
| | Warpage of semiconductor package | Shadow Moiré | Room temperature to 220° C. | μm | 126 | 126 | 128 | 151 |
| | Peak top temperature at which tanδ ≥0.05 | DMA | 10 Hz | ° C. | 60 285 | 60 220 | 30 295 | 240 |
| | Modulus of elasticity | DMA | Room temperature | GPa | 9 | 9 | 8 | 10 |
| | Tensile elongation | Autograph | Room temperature | % | 9 | 9 | 8 | 4 |

REFERENCE SIGNS LIST

1 Prepreg
11 Base Member
111 Warp
112 Woof
12 Semi-Cured Product
2 Chip
21 First Chip Surface
22 Second Chip Surface
3 Substrate
31 First Substrate Surface
32 Second Substrate Surface
4 Semiconductor Package
41 Insulating Layer
5 Metal-Clad Laminate
6 Metal Layer
7 Printed Wiring Board
8 Printed Circuit Board

The invention claimed is:

1. A semiconductor package comprising: a chip; and a substrate configured to mount the chip thereon,
the chip having: a first chip surface located opposite from the substrate; and a second chip surface located opposite from the first chip surface,
the semiconductor package satisfying the following relational expression (I):

[Numerical Expression 1]

$$0.9 \leq X_2/X_1 \leq 1.0 \tag{I}$$

where $X_1$ is a coefficient of thermal expansion of the first chip surface of the chip before the chip is mounted on the substrate, and $X_2$ is a coefficient of thermal expansion of the first chip surface of the chip after the chip has been mounted on the substrate.

2. The semiconductor package of claim 1, wherein
the substrate has: a first substrate surface configured to mount the chip thereon; and a second substrate surface located opposite from the first substrate surface, and the semiconductor package satisfies the following relational expression (II):

[Numerical Expression 2]

$$1.05 \leq Y_1/Y_2 \leq 2.00 \tag{II}$$

where $Y_1$ is a coefficient of thermal expansion of a first region on the second substrate surface before the chip is mounted on the first substrate surface, the first region being located opposite from a second region on the first substrate surface on which the chip is to be mounted, and $Y_2$ is a coefficient of thermal expansion of the first region after the chip has been mounted on the first substrate surface, the first region being located opposite from the second region on which the chip has been mounted.

3. The semiconductor package of claim 1, wherein the substrate comprises:
a base member; and
a cured product of a resin composition impregnated into the base member.

4. The semiconductor package of claim 3, wherein
the base member includes a woven fabric in which a warp and a woof have been woven substantially perpendicularly to each other, and
the substrate has a tensile elongation falling within a range from 5% to less than 30% in a direction that forms a tilt angle of 45 degrees with respect to either the warp or the woof.

5. The semiconductor package of claim 3, wherein
the resin composition includes at least one resin selected from the group consisting of epoxy resins, phenolic resins, imide resins, cyanate ester resins, acrylic resins, and vinyl ester resins.

6. A printed circuit board comprising:
the semiconductor package according to of claim 1; and
a printed wiring board configured to mount the semiconductor package thereon.

* * * * *